(12) United States Patent
Kawamura

(10) Patent No.: US 7,304,551 B2
(45) Date of Patent: Dec. 4, 2007

(54) BRANCHING FILTER AND COMMUNICATION DEVICE

(75) Inventor: Hideki Kawamura, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/520,015

(22) PCT Filed: Oct. 10, 2003

(86) PCT No.: PCT/JP03/13037

§ 371 (c)(1),
(2), (4) Date: Dec. 29, 2004

(87) PCT Pub. No.: WO2004/042921

PCT Pub. Date: May 21, 2004

(65) Prior Publication Data

US 2005/0237129 A1    Oct. 27, 2005

(30) Foreign Application Priority Data

Nov. 8, 2002 (JP) .......................... 2002-325672
Sep. 5, 2003 (JP) .......................... 2003-314646

(51) Int. Cl.
*H03H 9/00* (2006.01)
*H01L 41/00* (2006.01)
(52) U.S. Cl. .................. 333/133; 333/187; 333/189
(58) Field of Classification Search ............ 333/187, 333/189, 133; 310/363, 364
See application file for complete search history.

(56) References Cited

U.S. PATENT DOCUMENTS

| | | | |
|---|---|---|---|
| 5,373,268 A | 12/1994 | Dworsky et al. | |
| 6,262,637 B1 * | 7/2001 | Bradley et al. | 333/133 |
| 6,407,649 B1 * | 6/2002 | Tikka et al. | 333/133 |
| 6,472,954 B1 * | 10/2002 | Ruby et al. | 333/133 |
| 6,822,536 B1 * | 11/2004 | Nishimura et al. | 333/189 |
| 6,888,424 B2 * | 5/2005 | Takeuchi et al. | 333/187 |
| 6,897,740 B2 * | 5/2005 | Fujino et al. | 333/133 |
| 6,903,496 B2 * | 6/2005 | Takeuchi et al. | 310/363 |
| 6,982,612 B2 * | 1/2006 | Sakano | 333/133 |

(Continued)

FOREIGN PATENT DOCUMENTS

EP    0 609 555 A2    8/1994

(Continued)

OTHER PUBLICATIONS

K. Shimizu et al., "Sensitivity of Hydroxyapatite Film for Humidity"; Sep. 2002; vol. 63, No. 2, p. 555.

(Continued)

*Primary Examiner*—Dean Takaoka
(74) *Attorney, Agent, or Firm*—Keating & Bennett, LLP

(57) ABSTRACT

A branching filter and a communication device have excellent characteristics and an optimized configuration of a transmitting filter and a receiving filter. The branching filter includes a transmitting filter and a receiving filter wherein piezoelectric thin film resonators including a piezoelectric thin film sandwiched between opposed electrodes are arranged in a ladder type configuration on an opening or a recess of a substrate. The transmitting filter and the receiving filter are connected in parallel to an antenna terminal. The piezoelectric thin film resonators defining the transmitting filter and the piezoelectric thin film resonators defining the receiving filter are different from each other.

26 Claims, 22 Drawing Sheets

U.S. PATENT DOCUMENTS 7,002,437 B2 * 2/2006 Takeuchi et al. ............ 333/187

FOREIGN PATENT DOCUMENTS

| EP | 1 253 713 A2 | 10/2002 |
|---|---|---|
| JP | 06-295181 | 10/1994 |
| JP | 11-088111 | 3/1999 |
| JP | 11-284480 | 10/1999 |
| JP | 2000-244030 | 9/2000 |
| JP | 2000-278078 | 10/2000 |
| JP | 2001-024476 | 1/2001 |
| JP | 2001-274650 | 10/2001 |
| JP | 2002-217676 | 8/2002 |
| JP | 2002-268644 | 9/2002 |
| JP | 2003-022074 | 1/2003 |
| JP | 2003-324336 | 11/2003 |

OTHER PUBLICATIONS

Official Communication issued in the corresponding Taiwanese Patent Application No. 094100384, mailed on Feb. 13, 2006.

Official Communication issued in the counterpart Japanese Application No. 2003-314646, mailed on Aug. 28, 2007.

* cited by examiner

BRANCHING FILTER AND COMMUNICATION DEVICE

BACKGROUND OF THE INVENTION

1. Field of the Invention

The present invention relates to a branching filter including filters having piezoelectric thin film resonators, and the branching filter is preferably for use in a communication device, for example.

2. Description of the Related Art

In recent years, piezoelectric thin film filters using elastic bulk waves have been developed.

Such piezoelectric thin film filters are compact in size, are light weight, and have excellent vibration resistance and impact resistance. In addition, the piezoelectric thin film filters have small variation in products and high reliability, and can provide non-adjusting circuits. Therefore, the mounting process can be automated and simplified. Furthermore, even when the frequency is increased, the piezoelectric thin film filters can be easily produced. Thus, the piezoelectric thin film filters have superior characteristics.

A branching filter (duplexer) including such piezoelectric thin film filters has been proposed.

For example, Japanese Unexamined Patent Application Publication No. 2001-24476 discloses a branching filter including piezoelectric thin film filters in which the piezoelectric thin film resonators are arranged in a ladder configuration.

The piezoelectric thin film resonators used in the branching filter disclosed in Japanese Unexamined Patent Application Publication No. 2001-24476 define a transmitting filter and a receiving filter. In both filters, the electrodes are composed of Mo and piezoelectric thin films are composed of AlN.

However, the required characteristics are different between the transmitting filter and the receiving filter in the branching filter.

In other words, piezoelectric thin film resonators having the same structure are optimized only in either the transmitting filter or the receiving filter.

According to the Japanese Unexamined Patent Application Publication No. 2001-24476, the transmitting filter and the receiving filter have the same structure. Therefore, a branching filter having optimum characteristics in both transmitting and receiving cannot be achieved.

SUMMARY OF THE INVENTION

In view of the problems described above, preferred embodiments of the present invention provide a branching filter having excellent characteristics in which the configuration of the transmitting filter and the receiving filter is optimized.

In order to solve the above problems, a branching filter of the present invention includes a transmitting filter and a receiving filter wherein piezoelectric thin film resonators including at least one piezoelectric thin film sandwiched between at least one pair of opposed electrodes are arranged in a ladder configuration on an opening or a recess of a substrate, the transmitting filter and the receiving filter being connected to an antenna terminal in parallel. In the branching filter, the piezoelectric thin film resonators defining the transmitting filter and the piezoelectric thin film resonators defining the receiving filter have a different structure.

In the branching filter of preferred embodiments of the present invention, the piezoelectric thin film resonators defining the transmitting filter and the piezoelectric thin film resonators defining the receiving filter preferably include a different piezoelectric film.

In the branching filter of preferred embodiments of the present invention, the piezoelectric film of the piezoelectric thin film resonators defining the transmitting filter is preferably composed of AlN and the piezoelectric film of the piezoelectric thin film resonators defining the receiving filter is preferably composed of ZnO.

In the branching filter of preferred embodiments of the present invention, the material of the electrodes is preferably different between the piezoelectric thin film resonators defining the transmitting filter and the piezoelectric thin film resonators defining the receiving filter.

In the branching filter of preferred embodiments of the present invention, the acoustic impedance of the material of the electrodes is preferably different between the piezoelectric thin film resonators defining the transmitting filter and the piezoelectric thin film resonators defining the receiving filter.

In the branching filter of preferred embodiments of the present invention, the frequency of the pass band of the receiving filter is preferably higher than the frequency of the pass band of the transmitting filter, and the acoustic impedance of the material of the electrodes defining the receiving filter is preferably higher than the acoustic impedance of the material of the electrodes defining the transmitting filter.

In the branching filter of preferred embodiments of the present invention, the piezoelectric thin film resonators defining the transmitting filter preferably use second harmonic waves and the piezoelectric thin film resonators defining the receiving filter preferably use fundamental waves.

In the branching filter of preferred embodiments of the present invention, in addition to the above-described configuration, the piezoelectric thin film resonators defining the transmitting filter and the piezoelectric thin film resonators defining the receiving filter preferably include a different insulating film on the opening or the recess of the substrate.

In the branching filter of preferred embodiments of the present invention, the insulating film of the piezoelectric thin film resonators defining the receiving filter is preferably composed of $SiO_2$.

In the branching filter of preferred embodiments of the present invention, the insulating film of the piezoelectric thin film resonators defining the receiving filter is preferably composed of two layers including an $SiO_2$ layer adjacent to the piezoelectric thin film and an $Al_2O_3$ layer adjacent to the $SiO_2$ layer.

In the branching filter of preferred embodiments of the present invention, the insulating film of the piezoelectric thin film resonators defining the receiving filter is preferably composed of two layers including an $SiO_2$ layer adjacent to the piezoelectric thin film and an AlN layer adjacent to the $SiO_2$ layer.

In the branching filter of preferred embodiments of the present invention, the insulating film of the piezoelectric thin film resonators defining the transmitting filter is preferably composed of two layers including an AlN layer adjacent to the piezoelectric thin film and an $SiO_2$ layer adjacent to the AlN layer.

In the branching filter of preferred embodiments of the present invention, the insulating film of the piezoelectric thin film resonators defining the transmitting filter is preferably composed of two layers including an $Al_2O_3$ layer adjacent to the piezoelectric thin film and an $SiO_2$ layer adjacent to the $Al_2O_3$ layer.

A communication device of another preferred embodiment of the present invention includes the branching filter according to one of the preferred embodiments described above.

The branching filter of various preferred embodiments of the present invention preferably includes a transmitting filter and a receiving filter wherein piezoelectric thin film resonators including at least one piezoelectric thin film sandwiched between at least one pair of opposed electrodes are arranged in a ladder configuration on an opening or a recess of a substrate, the transmitting filter and the receiving filter being connected to an antenna terminal in parallel. In the branching filter, the piezoelectric thin film resonators defining the transmitting filter and the piezoelectric thin film resonators defining the receiving filter have a different structure.

According to the above-described unique configuration, the transmitting filter and the receiving filter include piezoelectric thin film resonators having different structures from each other. As a result, a branching filter having optimum characteristics in both of the transmitting filter and the receiving filter can be advantageously provided.

Other features, elements, characteristics and advantages of the present invention will become more apparent from the following detailed description of preferred embodiments with reference to the attached drawings.

DETAILED DESCRIPTION OF PREFERRED EMBODIMENTS

First Preferred Embodiment

A preferred embodiment of the present invention will now be described with reference to FIGS. 1 to 3.

In the present preferred embodiment, a duplexer in which the transmission band is about 1,850 MHz to about 1,910 MHz and the reception band is about 1,930 MHz to about 1,990 MHz will now be described.

Figure 1:
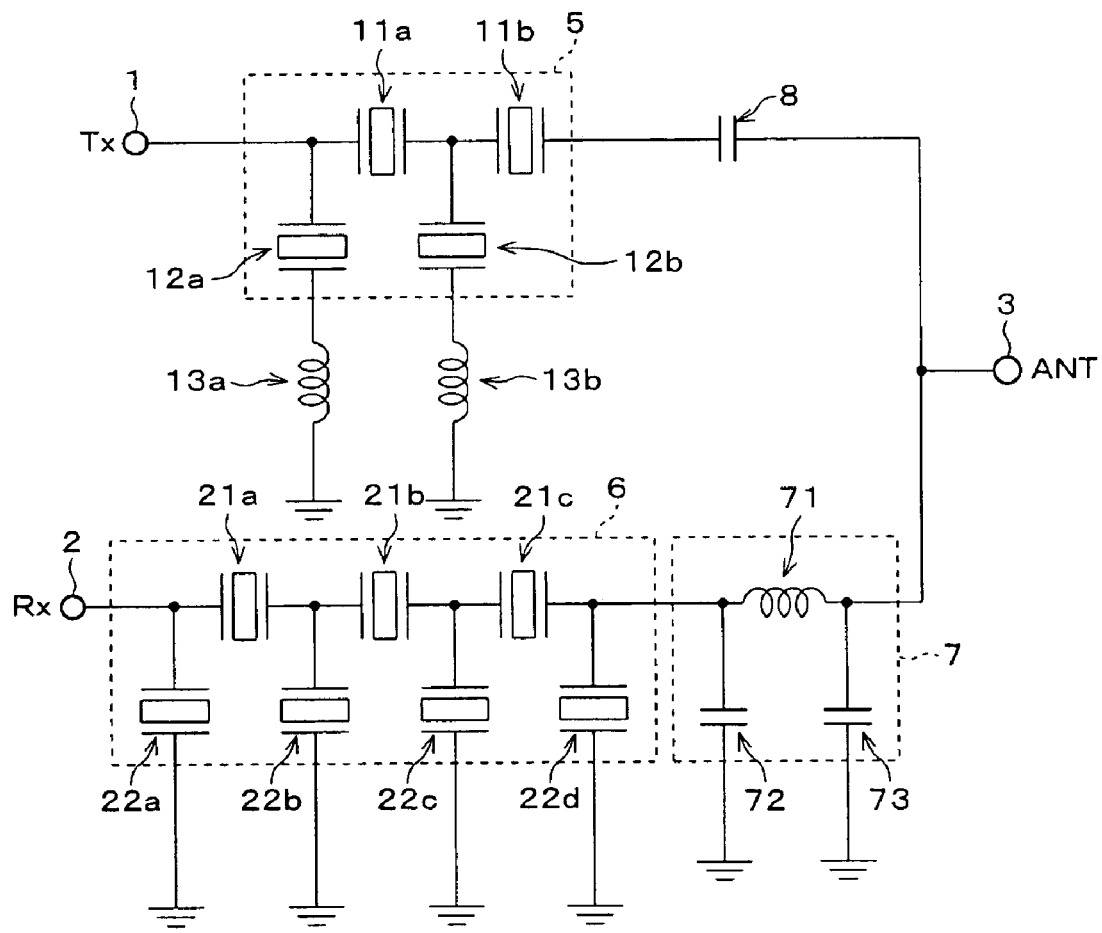
FIG. 1 is a circuit diagram of a duplexer according to a preferred embodiment of the present invention.

As shown in FIG. 1, the duplexer (branching filter) according to the present preferred embodiment preferably includes a transmitting terminal 1, a receiving terminal 2, and an antenna terminal 3.

The duplexer preferably includes a transmitting filter 5, a receiving filter 6, and a matching circuit 7. The transmitting filter 5 is disposed between the antenna terminal 3 and the transmitting terminal 1. The receiving filter 6 is disposed between the antenna terminal 3 and the receiving terminal 2. The matching circuit 7 is disposed between the antenna terminal 3 and the receiving filter 6.

In other words, in the duplexer, the transmitting filter 5 and the receiving filter 6 are connected to the antenna terminal 3 in parallel.

A capacitance 8 is disposed between the antenna terminal 3 and the transmitting filter 5.

The pass band in the transmitting filter 5 and that in the receiving filter 6 are set so as to be different from each other.

The transmitting filter 5 includes series resonators 11a and 11b and parallel resonators 12a and 12b arranged in a ladder configuration.

The parallel resonators 12a and 12b are grounded through inductances 13a and 13b.

The inductances 13a and 13b can extend the pass band of the transmitting filter 5.

The receiving filter 6 includes series resonators 21a, 21b, and 21c and parallel resonators 22a, 22b, 22c, and 22d arranged in a ladder configuration.

The parallel resonators 22a, 22b, 22c, and 22d are grounded.

The matching circuit 7 includes an inductance 71 connected in series and capacitances 72 and 73 connected in parallel.

In the present preferred embodiment, the resonators in the transmitting filter 5 and the receiving filter 6 are piezoelectric thin film resonators. Each of the piezoelectric thin film resonators includes a thin film (piezoelectric thin film) composed of a piezoelectric material and electrodes that sandwich the piezoelectric thin film and are opposed to each other.

The characteristics desired for the transmitting filter 5 and the receiving filter 6 wherein the transmitting filter has relatively low frequency characteristics and the receiving filter has relatively high frequency characteristics will now be described.

A large electric power is applied to the transmitting filter 5.

Therefore, the resonators used in the transmitting filter 5 preferably have a high Q factor.

This Q factor represents the mechanical vibration loss in a resonator.

Since a low Q factor increases the mechanical vibration loss in the resonator, the loss causes heat and the resonator generates heat. As a result, the lifetime of the resonator is shortened.

Furthermore, the lifetime of the transmitting filter 5 is also shortened.

The Q factor depends on the structure of the resonator. Furthermore, the smaller the elastic loss of the material used in the resonator, the higher the Q factor is.

Since the elastic loss of materials also depends on the frequency etc., it is difficult to mention the specific values. However, propagation loss, which is often used in, for example, a surface acoustic wave device, is an indicator.

That is, the smaller the propagation loss of the material used in the resonator, the higher the Q factor of the resonator is.

A material having a high thermal conductivity is preferably used as the resonators in the transmitting filter 5.

The reason for this is as follows: A low thermal conductivity decreases the heat dissipation effect. As a result, the resonator is heated and the lifetime of the resonator is shortened.

The electromechanical coupling coefficient $k^2$ (effective coupling coefficient $k^2_{eff}$) of the resonators in the transmitting filter 5 is preferably about 3% to about 4%.

The reason for this is as follows: Even when the electromechanical coupling coefficient $k^2_{eff}$ is small, the pass band can be extended to the low frequency side to some degree with an external circuit (for example, an extended inductance).

When the electromechanical coupling coefficient $k^2_{eff}$ is about 5% or more, roll-off characteristics at the high frequency side (i.e., the steepness of the attenuation in the range from the pass band of about 1,910 MHz in the transmitting to the pass band of about 1,930 MHz in the receiving) is deteriorated.

The use of a material having a large electromechanical coupling coefficient $k^2$ as the piezoelectric thin film increases the $k^2_{eff}$ of the resonator.

The electromechanical coupling coefficient $k^2_{eff}$ also depends on the structure of the resonator.

In the receiving filter 6, when the pass band is extended to the low frequency side with an external circuit, the receiving filter 6 interferes with the transmitting filter 5.

In addition, an external circuit cannot extend the pass band to the high frequency side.

For these reasons, in the receiving filter 6, a predetermined filter band must be provided using resonators having a large electromechanical coupling coefficient $k^2_{eff}$ and without an auxiliary external circuit.

The structure of the piezoelectric thin film resonator of the transmitting filter 5 and the piezoelectric thin film resonator of the receiving filter 6 having the above-described characteristics will now be described in detail with reference to FIGS. 2 and 3.

Figure 2:
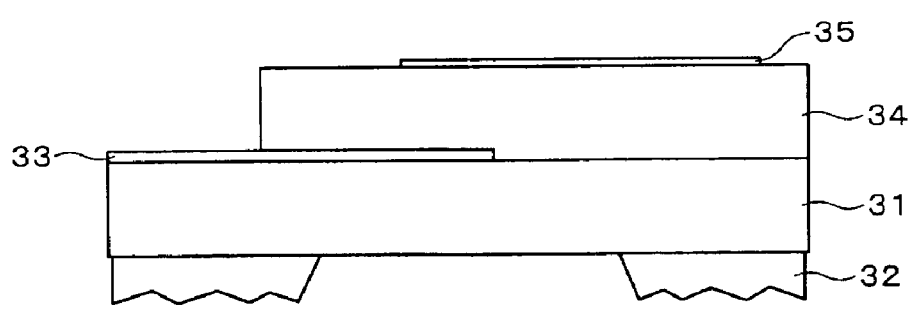
FIG. 2 is a schematic cross-sectional view showing the structure of a resonator of a transmitting filter in the duplexer.

As shown in FIG. 2, a resonator of the transmitting filter 5 includes a supporting substrate 32 preferably composed of silicon (Si) and an insulating film 31 disposed on the supporting substrate 32.

Furthermore, the supporting substrate 32 includes an opening or hollow portion that penetrates the supporting substrate 32 in the direction of the thickness and extends to the other side of the insulating film 31.

A lower electrode 33, a piezoelectric thin film 34, and an upper electrode 35 are disposed on the insulating film 31 in that order.

The insulating film 31 forms a diaphragm.

This diaphragm faces the opening or hollow portion.

Figure 3:
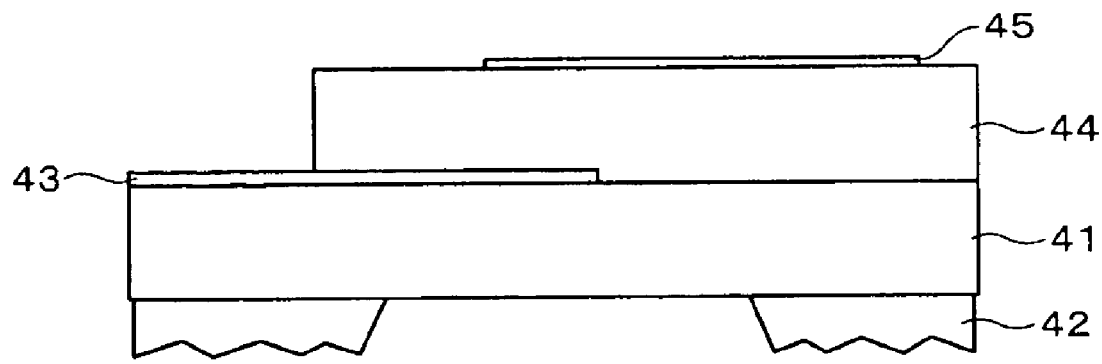
FIG. 3 is a schematic cross-sectional view showing the structure of a resonator of a receiving filter in the duplexer.

As shown in FIG. 3, a resonator of the receiving filter 6 includes a supporting substrate 42 composed of silicon (Si) and an insulating film 41 disposed on the supporting substrate 42.

Furthermore, the supporting substrate 42 includes an opening or hollow portion that penetrates the supporting substrate 42 in the direction of the thickness and extends to the insulating film 41.

A lower electrode 43, a piezoelectric thin film 44, and an upper electrode 45 are disposed on the insulating film 41 in that order.

The insulating film 41 forms a diaphragm.

This diaphragm faces the opening or hollow portion.

Second harmonic waves are used in the resonators shown in FIGS. 2 and 3.

In the present preferred embodiment, the type of the piezoelectric thin film is different between the resonators of the transmitting filter 5 and the resonators of the receiving filter 6.

In the resonators of the transmitting filter 5, the piezoelectric thin film 34 is preferably composed of AlN, the insulating film 31 is preferably composed of $SiO_2$, and the lower electrode 33 and the upper electrode 35 are preferably composed of Au/Ti.

In the resonators of the receiving filter 6, the piezoelectric thin film 44 is preferably composed of ZnO, the insulating film 41 is preferably composed of $SiO_2$, and the lower electrode 43 and the upper electrode 45 are preferably composed of Au/Ti.

The resonators of the transmitting filter 5 will now be described in more detail.

Aluminum nitride (AlN) has a thermal conductivity that is higher than that of ZnO and has an elastic loss that is smaller than that of ZnO.

Aluminum nitride (AlN) has a small electromechanical coupling coefficient ($k_t$=0.23, thermal conductivity W/(m·° C.)=150).

Accordingly, the resonators of the transmitting filter 5 have a Q factor and a heat dissipation effect higher than those of the resonators of the receiving filter 6.

Furthermore, in the resonators of the transmitting filter 5, the insulating film 31 composed of $SiO_2$ is preferably used. Therefore, the sign of the temperature coefficient of the insulating film 31 composed of $SiO_2$ and that of the piezoelectric thin film 34 composed of AlN are opposite with respect to each other.

Therefore, the temperature change is cancelled out in the piezoelectric thin film 34 and the insulating film 31. As a result, the temperature characteristics in the resonators of the transmitting filter 5 can be improved.

The acoustic velocity in AlN is larger than that in ZnO. In order to obtain a frequency that is equivalent to that of the resonator using ZnO, the film thickness of the diaphragm must be increased or an electrode material having a large density must be used.

When the film thickness of AlN is increased, the area (vibration portion) where the upper electrode 35 is overlapped with the lower electrode 33 must be increased in order that the capacitance ($C_0$) of the resonator is controlled to be a predetermined value. As a result, the element size is increased.

However, a metal having a density of at least about 8 $g/cm^3$ (for example, Au: 19.3, Pt: 21.45, Ni: 8.9, and Mo: 10.4) can be used as at least one of the upper electrode 35 and the lower electrode 33. In this case, the predetermined frequency can be obtained without increasing the area of the upper electrode 35 or the lower electrode 33.

The resonators of the receiving filter 6 will now be described in more detail.

Zinc oxide (ZnO) has an electromechanical coupling coefficient that is larger than that of AlN ($k_t$=0.30).

Accordingly, the resonators of the receiving filter 6 have a large electromechanical coupling coefficient $k^2_{eff}$.

Zinc oxide (ZnO) has a thermal conductivity lower than that of AlN (thermal conductivity W/(m·° C.)=4).

Furthermore, in the resonators of the receiving filter 6, the insulating film 41 that is preferably composed of $SiO_2$ is used.

Therefore, the sign of the temperature coefficient of the insulating film 41 composed of $SiO_2$ and that of the piezoelectric thin film 44 composed of ZnO are opposite with respect to each other.

Therefore, the temperature change is cancelled out in the piezoelectric thin film 44 and the insulating film 41. As a result, the temperature characteristics in the resonators of the receiving filter 6 can be improved.

In the resonators of the transmitting filter 5, AlN having a small electromechanical coupling coefficient $k^2_{eff}$ is used as the piezoelectric thin film 34. Therefore, the electromechanical coupling coefficient $k^2_{eff}$ of the resonators of the transmitting filter is smaller than that of the resonators of the receiving filter.

As shown in FIG. 1, the inductances 13a and 13b are connected to the parallel resonators 12a and 12b of the transmitting filter 5. Therefore, in this case, the pass band can be extended to the low frequency side, thereby obtaining the desired bandwidth.

Second Preferred Embodiment

Another preferred embodiment of the present invention will now be described with reference to FIGS. 4 to 8.

For the convenience of description, components having the same function as those of the components shown in the first preferred embodiment have the same reference numerals and the description is omitted.

Figure 4:
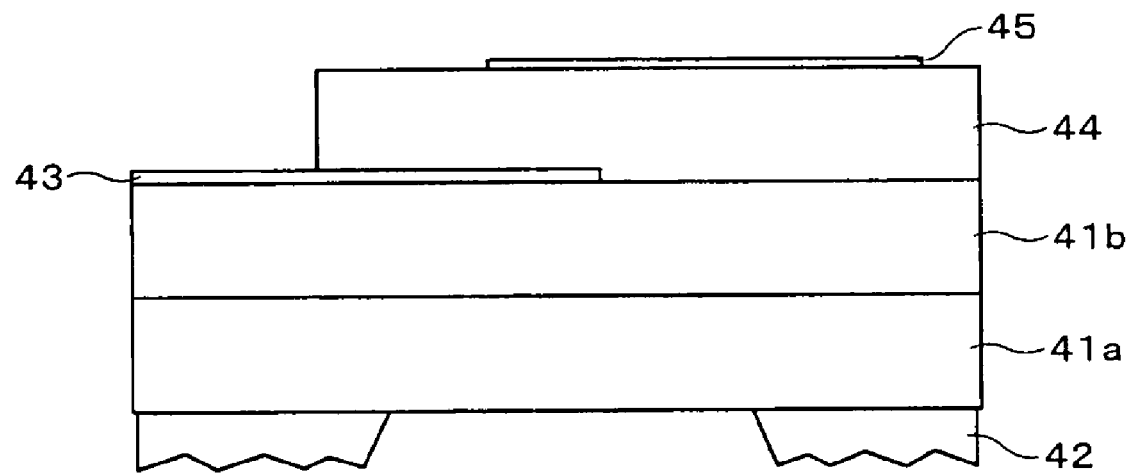
FIG. 4 is a schematic cross-sectional view showing the structure of a resonator of a receiving filter according to a preferred embodiment of the present invention.

In the present preferred embodiment, as shown in FIG. 4, an insulating film 41 in the resonators of the receiving filter 6 is preferably composed of two layers: An insulating film 41a is disposed on a substrate 42 and an insulating film 41b is disposed on the insulating film 41a.

In the present preferred embodiment, the insulating film 41a is preferably composed of $Al_2O_3$ and the insulating film 41b is preferably composed of $SiO_2$.

In this structure, a compressive stress is applied on the piezoelectric thin film 44 composed of ZnO and the insulating film 41b composed of $SiO_2$, whereas a tensile stress is applied on the insulating film 41a composed of $Al_2O_3$.

This structure stabilizes the strength of the diaphragm.

In the present preferred embodiment, the insulating film 41a may be composed of AlN.

In this case, the sign of the temperature coefficient of the insulating film 41a composed of AlN and that of the insulating film 41b composed of $SiO_2$ are opposite with respect to each other.

Therefore, the temperature change is cancelled out in the insulating film 41a and the insulating film 41b. As a result, the temperature characteristics in the resonators of the receiving filter 6 are greatly improved.

Furthermore, since AlN is superior in the thermal conductivity compared with $Al_2O_3$, the heat dissipation effect can be improved.

The above-described structure can increase the electromechanical coupling coefficient $k^2_{eff}$.

This is because the acoustic impedance of $SiO_2$ defining the insulating film 41b is about $1.3 \times 10^7$ ($N·s/m^3$), which is smaller than that of ZnO (about $3.5 \times 10^7$ ($N·s/m^3$)) defining the piezoelectric thin film 44, that of $Al_2O_3$ (about $3.9 \times 10^7$ ($N·s/m^3$)) and that of AlN (about $3.5 \times 10^7$ ($N·s/m^3$)) defining the insulating film 41a.

In other words, acoustic waves are significantly reflected at the interface between the piezoelectric thin film 44 and the insulating film 41b, and the energy of the acoustic waves is concentrated on the piezoelectric thin film 44. Accordingly, the electromechanical coupling coefficient $k^2_{eff}$ can be increased.

Figure 5:
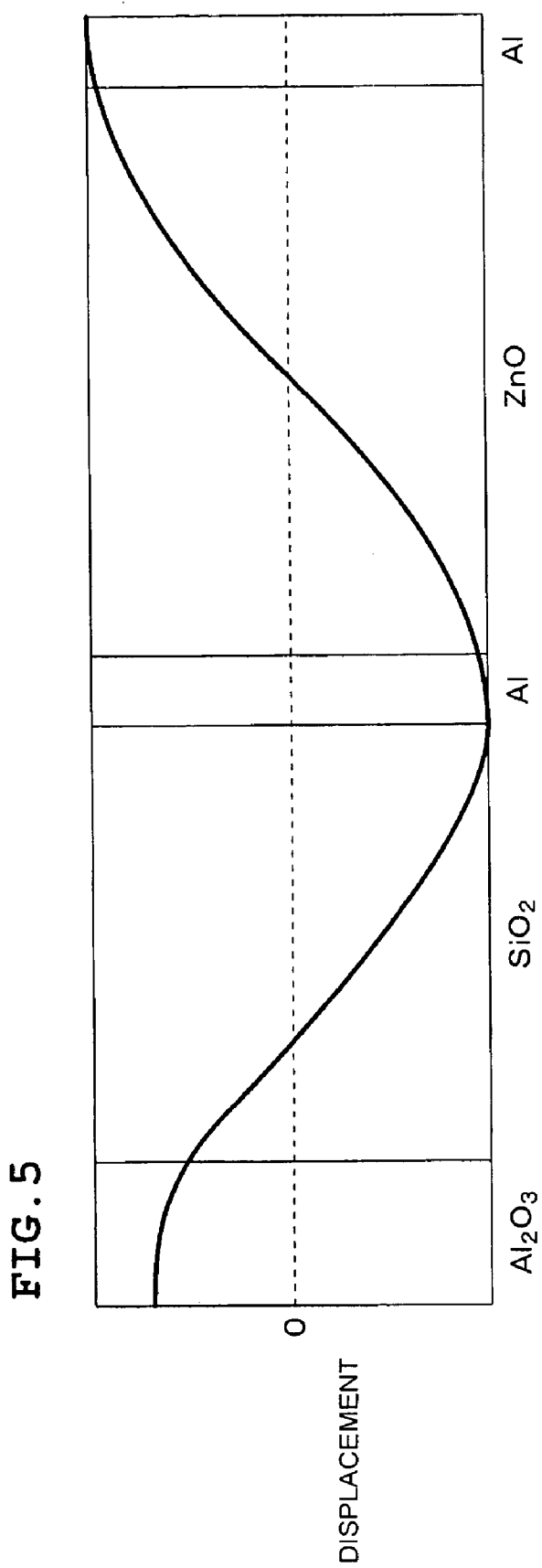
FIG. 5 is a graph showing the displacement of vibration of each layer in an example of the resonator in FIG. 4.

As shown in the displacement diagram of vibration in FIG. 5, the displacement of vibration in ZnO of the piezoelectric thin film 44 is larger than that in $SiO_2$ of the insulating film 41b.

Figure 6:
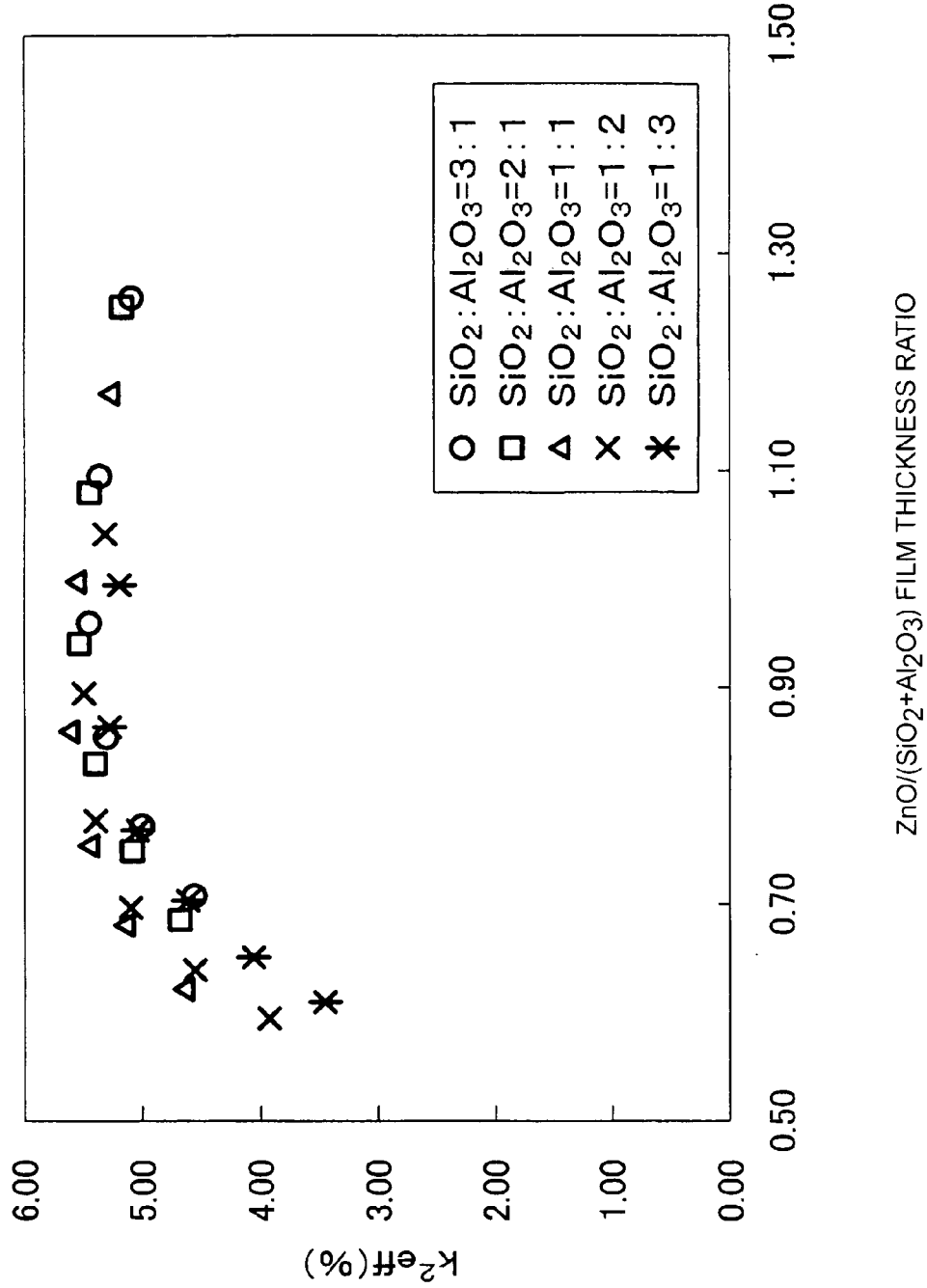
FIG. 6 is a graph showing the relationship between the electromechanical coupling coefficient $k^2_{eff}$ and the film thickness ratio in the resonator in FIG. 4.

The thickness of the piezoelectric thin film 44, the insulating film 41a composed of $Al_2O_3$, and the insulating film 41b composed of $SiO_2$ will now be described. As shown in FIG. 6, in terms of large electromechanical coupling coefficient $k^2_{eff}$, the film thickness ratio represented by the thickness of the piezoelectric thin film 44: (the thickness of the insulating film 41a composed of $Al_2O_3$+ the thickness of the insulating film 41b composed of $SiO_2$) is preferably about 0.7 to about 1.3.

Figure 7:
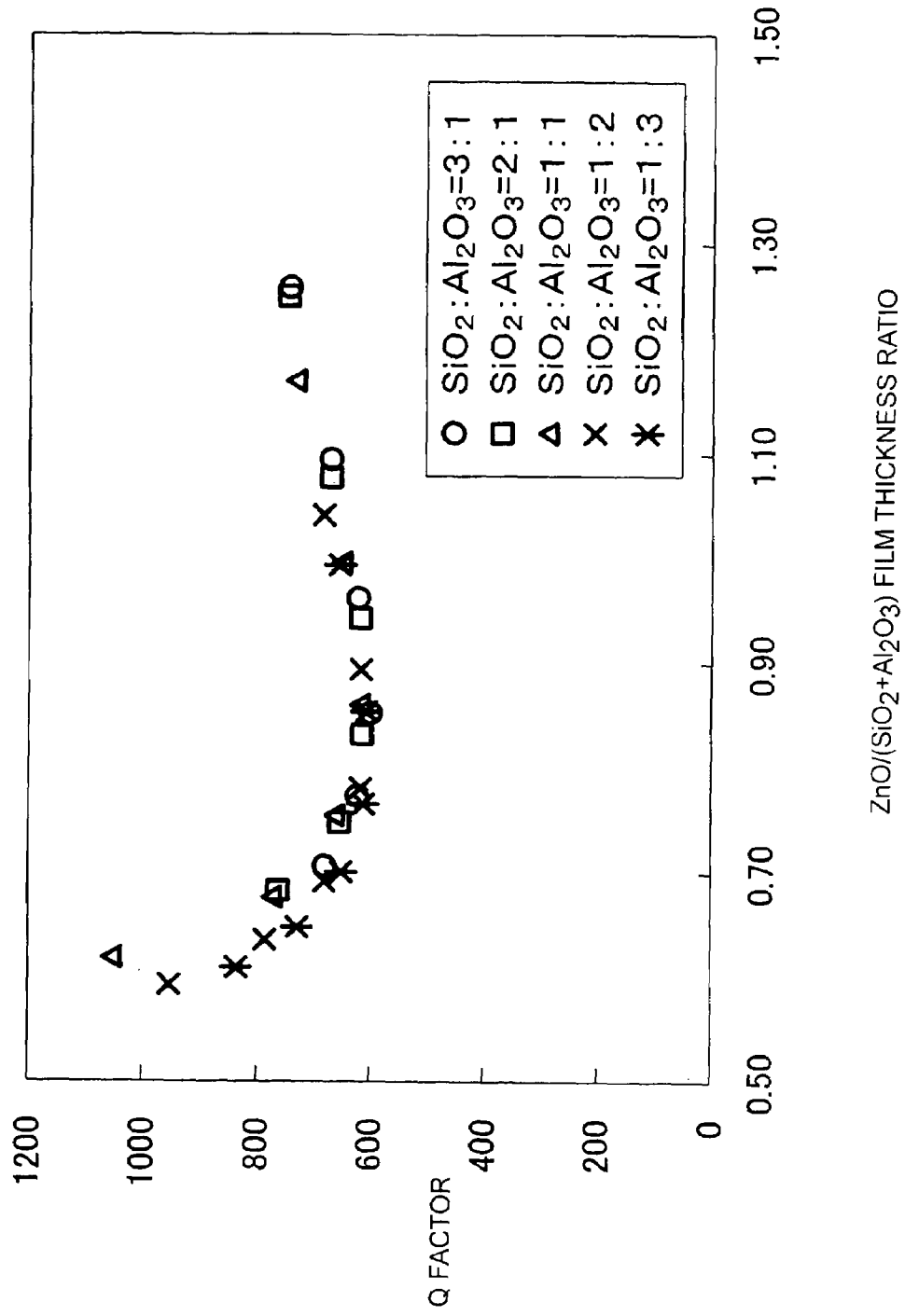
FIG. 7 is a graph showing the relationship between Q factor and the film thickness ratio in the resonator in FIG. 4.

Furthermore, as shown in FIG. 7, in terms of high Q factor, the film thickness ratio is preferably about 0.6 to about 0.8.

Figure 8:
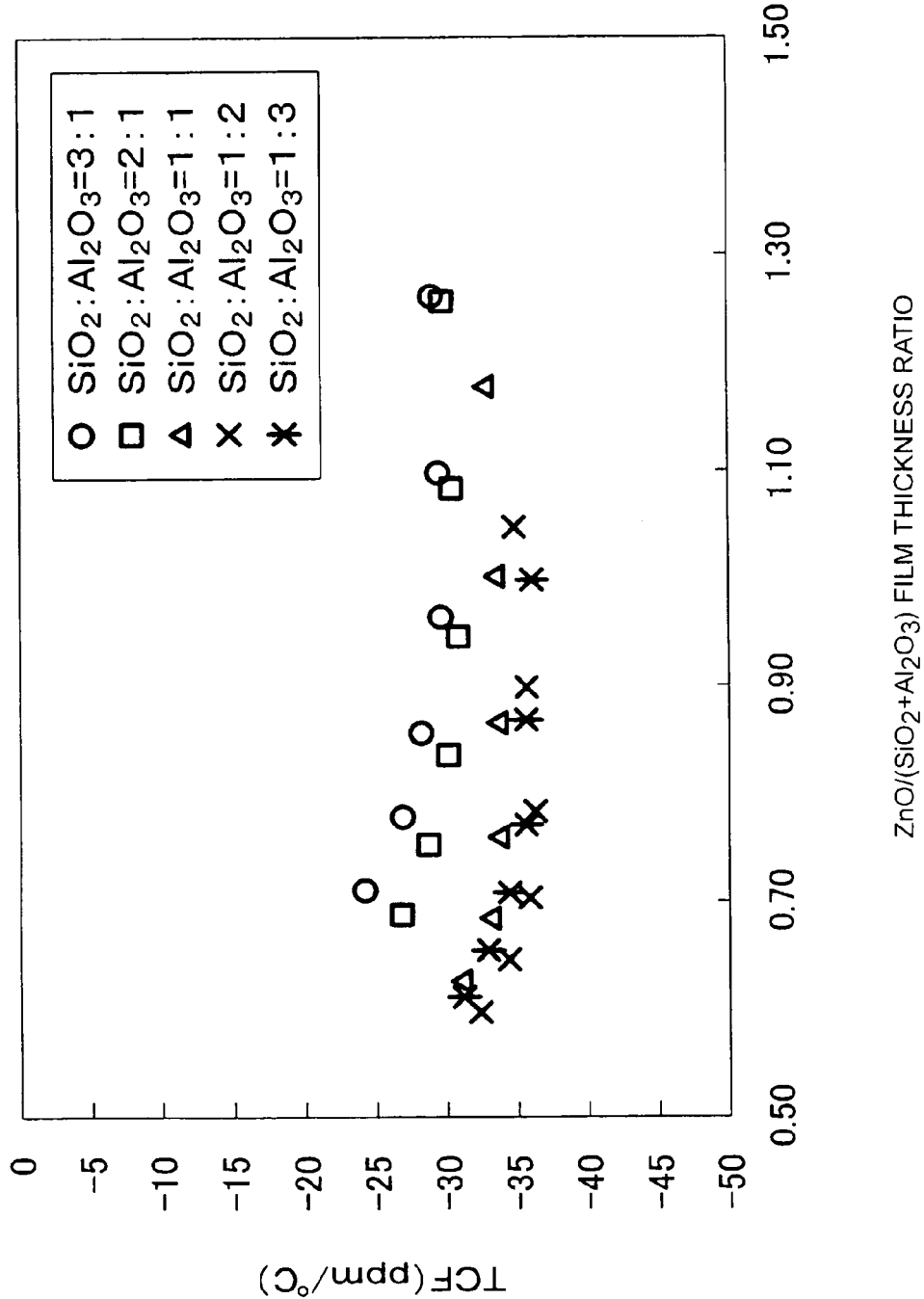
FIG. 8 is a graph showing the relationship between the temperature coefficient of frequency (TCF) and the film thickness ratio in the resonator in FIG. 4.

As shown in FIG. 8, in terms of small absolute value of the temperature coefficient of frequency (TCF), the film thickness ratio represented by the insulating film 41a ($Al_2O_3$): the insulating film 41b ($SiO_2$) is preferably about 1 or more.

However, when the ratio of the insulating film 41a to the insulating film 41b is excessively small, the problem of stress balance occurs. Therefore, the film thickness ratio represented by the insulating film 41a ($Al_2O_3$): the insulating film 41b ($SiO_2$) is more preferably about 1 to about 3.

In FIGS. 6 to 8, the piezoelectric thin film 44 is preferably composed of ZnO, the insulating film 41a is preferably composed of $Al_2O_3$, and the insulating film 41b is preferably composed of $SiO_2$.

The upper electrode 45 and the lower electrode 43 that sandwich the piezoelectric thin film 44 are preferably composed of Al and have a film thickness of about 180 nm.

The figures show the calculation results in which the film thickness ratio of the insulating film 41b ($SiO_2$) to the insulating film 41a ($Al_2O_3$) is varied from about 3:1 to about 1:3 under the above-described conditions.

The absolute amount of each film thickness is determined such that the frequency band of the resonators is controlled to be about 1,900 MHz.

Third Preferred Embodiment

A further preferred embodiment of the present invention will now be described with reference to FIGS. 9 to 17.

For the convenience of description, components having the same function as those of the components shown in the first preferred embodiment and the second preferred embodiment have the same reference numerals and the description is omitted.

Figure 9:
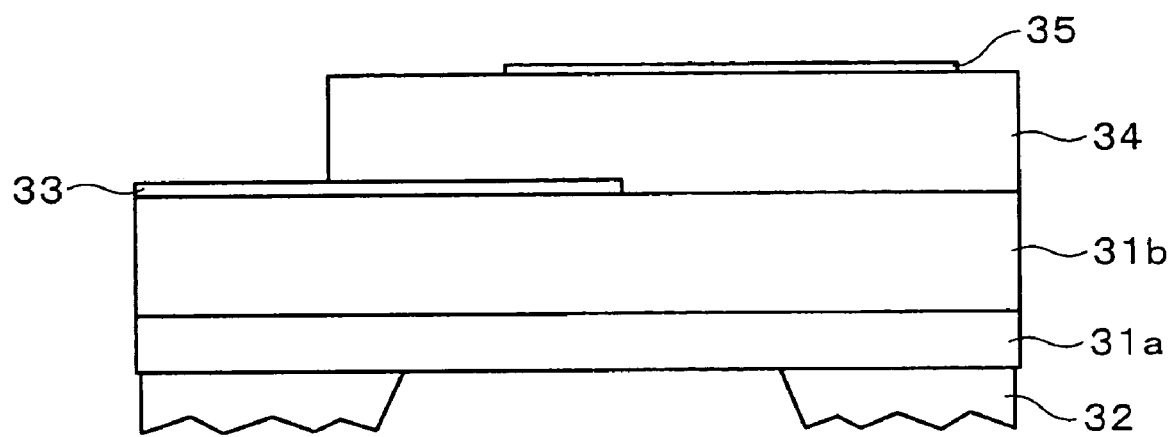
FIG. 9 is a schematic cross-sectional view showing the structure of the resonator in a transmitting filter according to a preferred embodiment of the present invention.

In the present preferred embodiment, as shown in FIG. 9, an insulating film 31 in the resonators of the transmitting filter 5 is preferably composed of two layers: An insulating film 31a is disposed on a substrate 32 and an insulating film 31b is disposed on the insulating film 31a.

In the present preferred embodiment, the insulating film 31a is preferably composed of $SiO_2$ and the insulating film 31b is preferably composed of AlN.

In this case, since AlN is superior in the thermal conductivity, the heat dissipation effect of the element can be improved.

This structure can achieve high withstand power, extend the lifetime, and improve the reliability of the element.

In the present preferred embodiment, the insulating film 31a may be composed of $SiO_2$ and the insulating film 31b may be composed of $Al_2O_3$.

In this structure, a compressive stress is applied on the insulating film 31a composed of $SiO_2$, whereas a tensile stress is applied on the insulating film 31b composed of $Al_2O_3$.

This structure can stabilize the strength of the diaphragm.

The above-described structure can decrease the absolute value of the temperature coefficient of frequency (TCF).

The reason for this is as follows: The temperature coefficient of ZnO, $Al_2O_3$, and AlN that are used as the piezoelectric thin film 34 or the insulating film 31b is negative (i.e., the rise in temperature decreases the frequency). On the other hand, the temperature coefficient of $SiO_2$ used as the insulating film 31a is positive.

Figure 10:
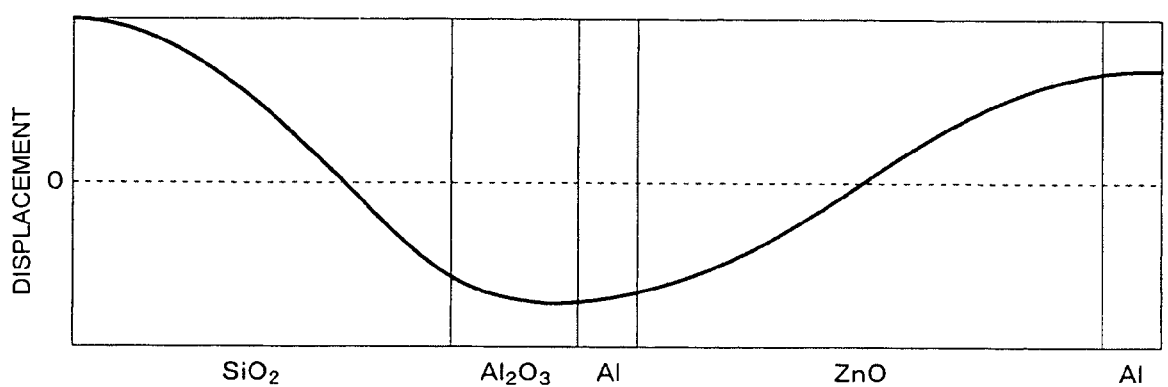
FIG. 10 is a graph showing the displacement of vibration of each layer in an example of the resonator in FIG. 9.

As shown in the displacement diagram of vibration in FIG. 10 (wherein ZnO is used as the piezoelectric thin film 34), the displacement of vibration in ZnO of the piezoelectric thin film 34 is strongly affected by the temperature coefficient of $SiO_2$ defining the insulating film 31a. As a result, the TCF of the whole resonator is shifted in the positive direction (i.e., comes close to zero).

Figure 11:
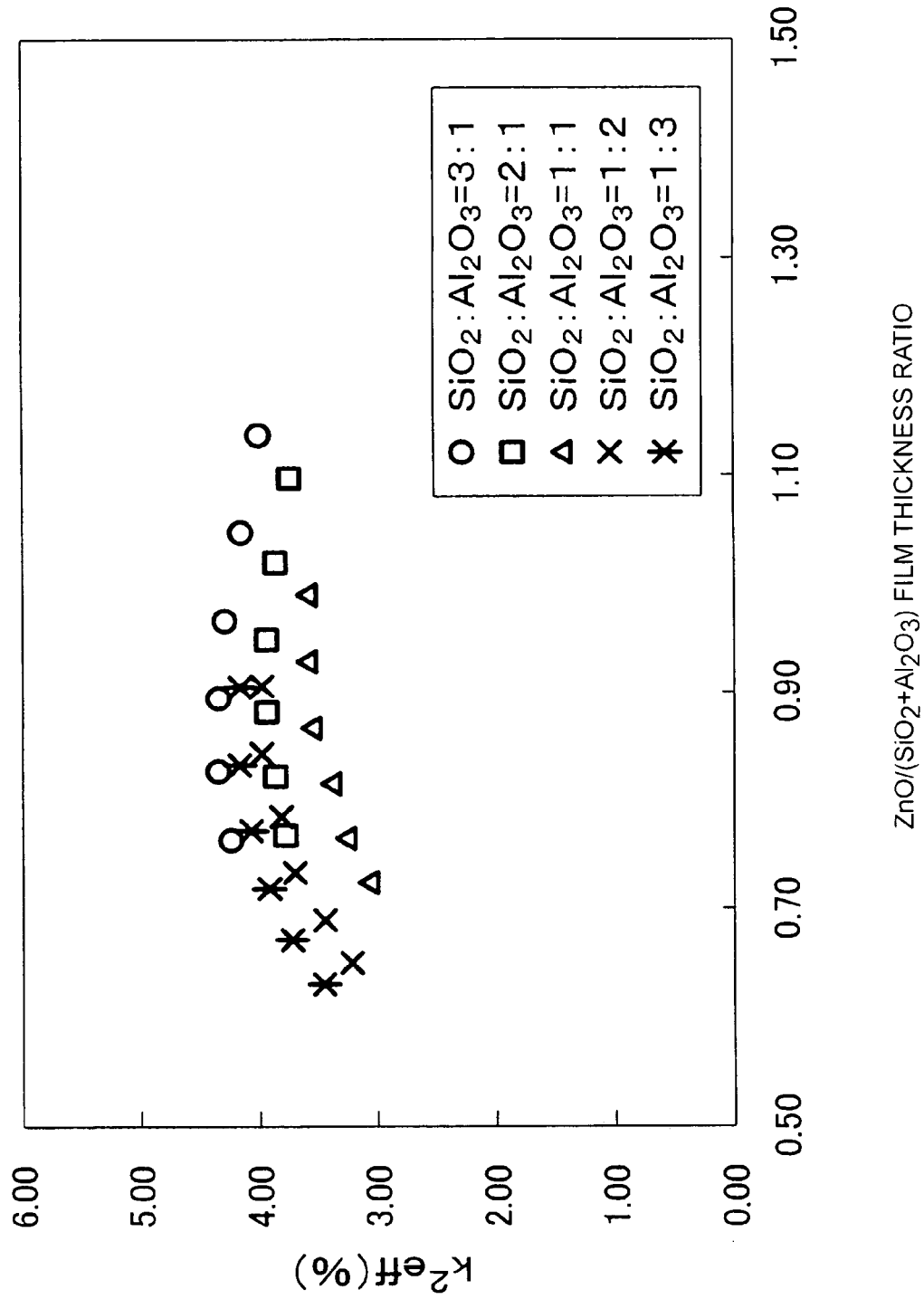
FIG. 11 is a graph showing the relationship between $k^2_{eff}$ and the film thickness ratio in the resonator in FIG. 9.
Figure 12:
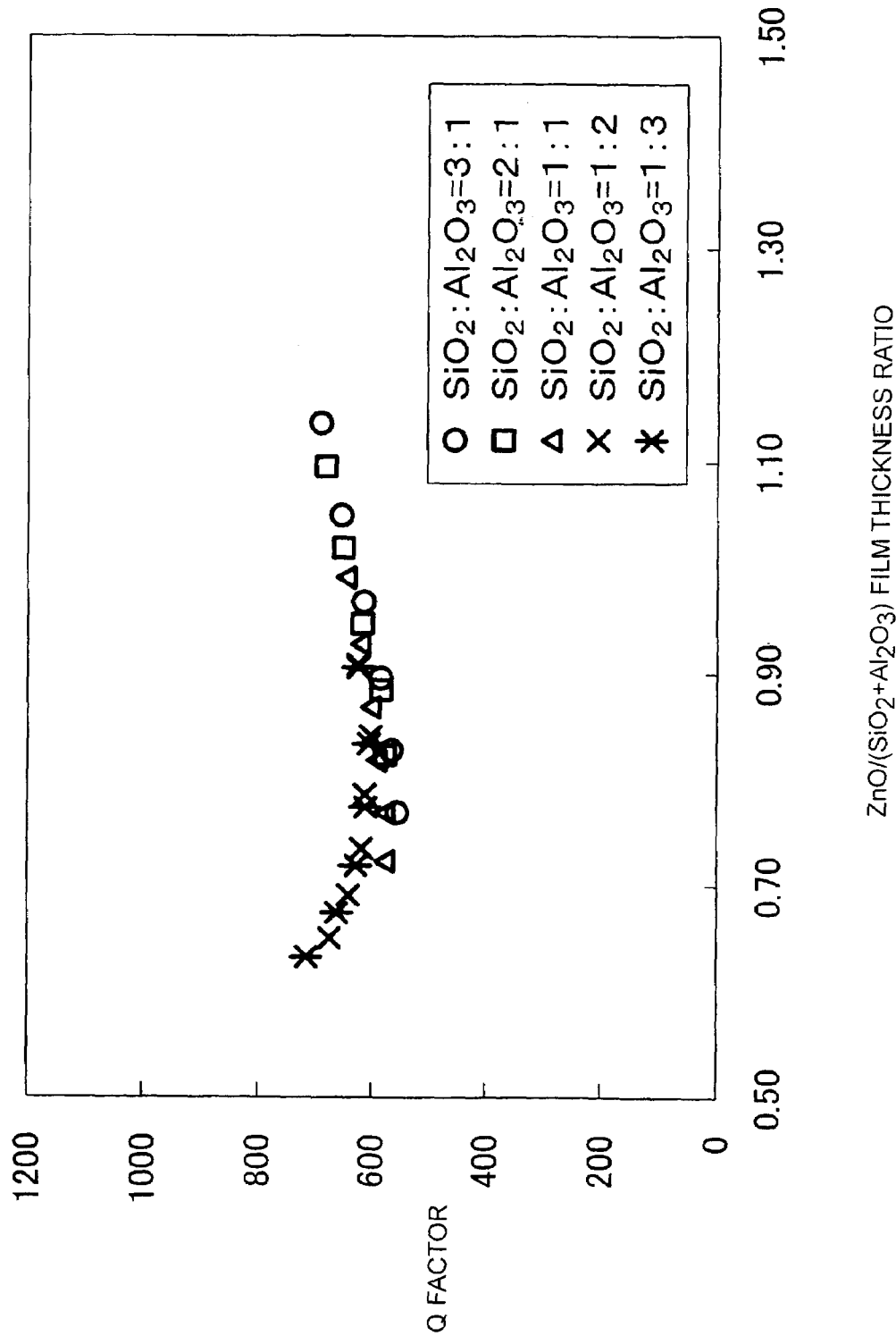
FIG. 12 is a graph showing the relationship between Q factor and the film thickness ratio in the resonator in FIG. 9.

When the above-described piezoelectric thin film 34, the insulating film 31a composed of $SiO_2$, and the insulating film 31b composed of $Al_2O_3$ are used, the thickness of the insulating film 31a and the insulating film 31b is preferably as follows. As shown in FIGS. 11 and 12, in terms of large electromechanical coupling coefficient $k^2_{eff}$ and high Q factor, since the dependency to the thickness of the piezoelectric thin film 34 is small, the film thickness ratio is not particularly limited. However, the film thickness ratio represented by the thickness of the piezoelectric thin film 34: (the thickness of the insulating film 31a composed of $SiO_2$+ the thickness of the insulating film 31b composed of $Al_2O_3$) is preferably about 0.7 to about 1.2.

Figure 13:
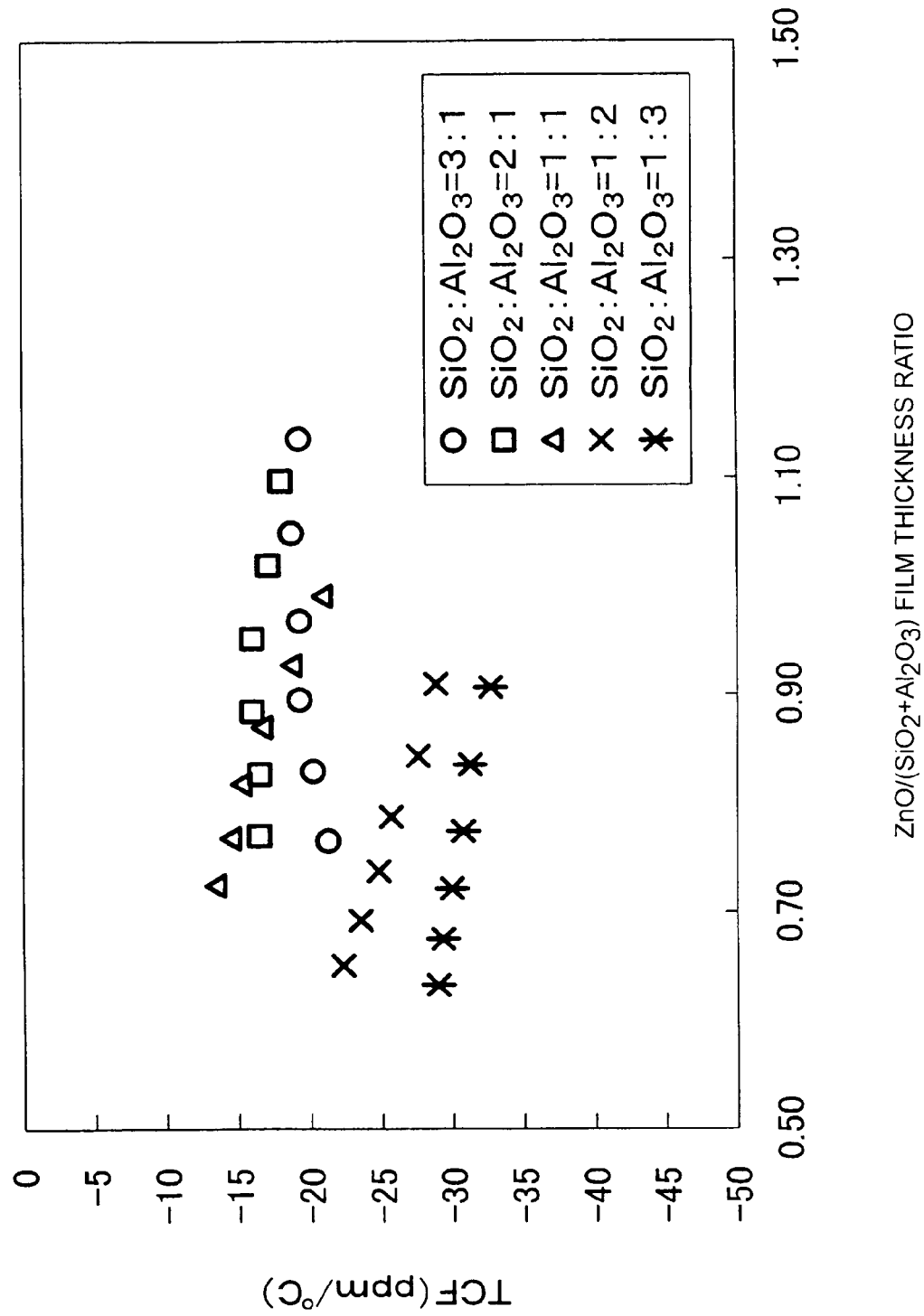
FIG. 13 is a graph showing the relationship between TCF and the film thickness ratio in the resonator in FIG. 9.

As shown in FIG. 13, in terms of small absolute value of the temperature coefficient of frequency (TCF), the film thickness ratio represented by the insulating film 31a ($SiO_2$): the insulating film 31b ($Al_2O_3$) is preferably about 1 or more.

However, when the ratio of the insulating film 31a ($SiO_2$) to the insulating film 31b ($Al_2O_3$) is excessively small, the problem of stress balance occurs. Therefore, the film thickness ratio represented by the insulating film 31a ($SiO_2$): the insulating film 31b ($Al_2O_3$) is more preferably about 1 to about 3.

In FIGS. 11 to 13, the piezoelectric thin film 34 is preferably composed of ZnO, the insulating film 31a is preferably composed of $SiO_2$, and the insulating film 31b is preferably composed of $Al_2O_3$.

The upper electrode 35 and the lower electrode 33 that sandwich the piezoelectric thin film 34 are preferably composed of Al and preferably have a film thickness of about 180 nm.

The figures show the calculation results in which the film thickness ratio of the insulating film 31b ($Al_2O_3$) to the insulating film 31a ($SiO_2$) is varied from about 3:1 to about 1:3 under the above conditions.

The absolute amount of each film thickness is determined such that the frequency band of the resonators is controlled to be about 1,900 MHz.

Figure 14:
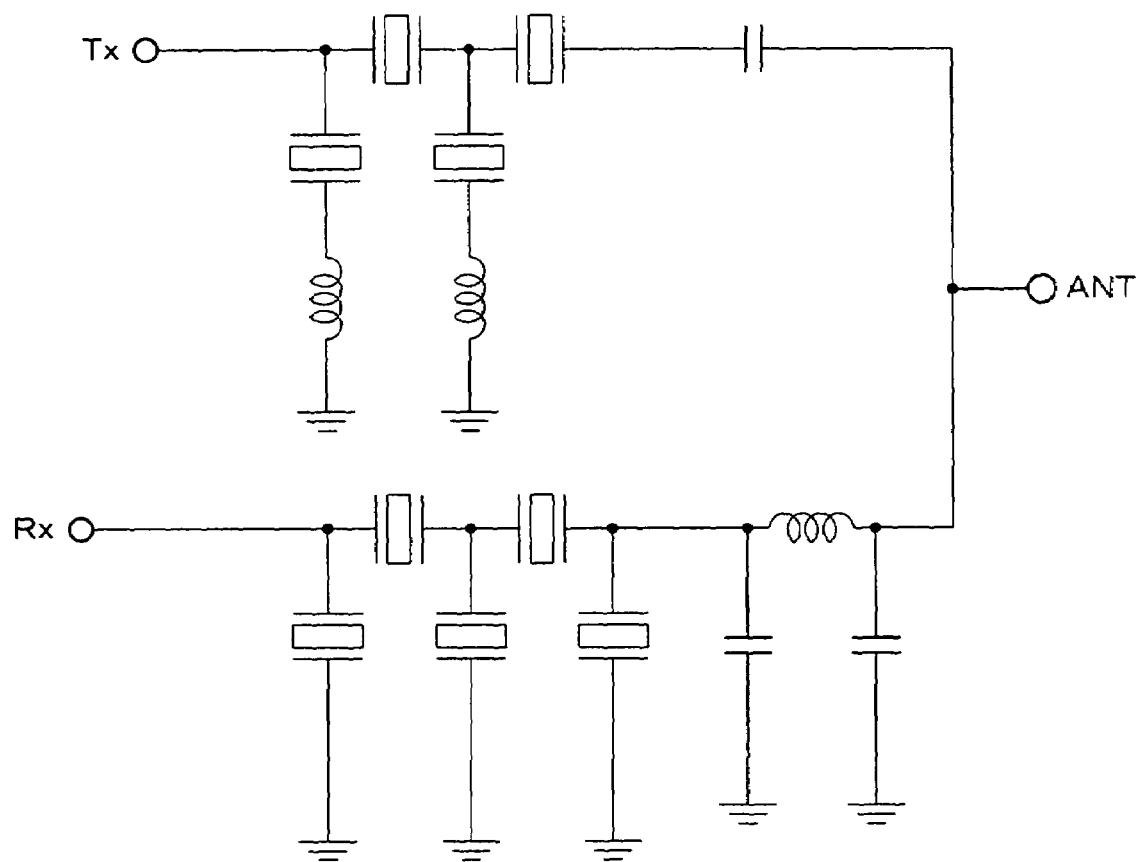
FIG. 14 is a circuit diagram showing a modification of the duplexer.

As shown in FIG. 14, the receiving filter may include two series resonators and three parallel resonators.

Figure 15:
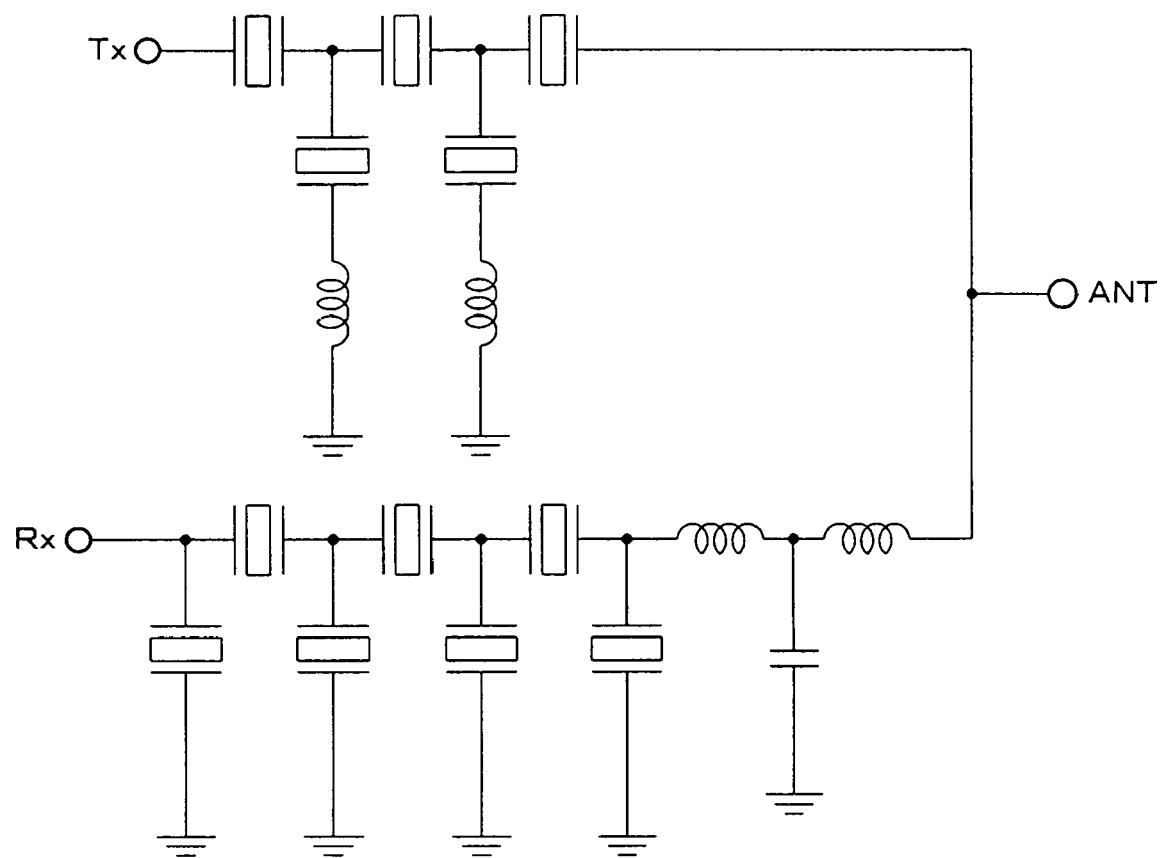
FIG. 15 is a circuit diagram showing a modification of the duplexer.

As shown in FIG. 15, in the transmitting filter, a resonator may be added in series adjacent to the transmitting terminal. The matching circuit may include two inductances connected in series and a capacitance connected in parallel. Furthermore, the capacitance 8 may be omitted.

Figure 16:
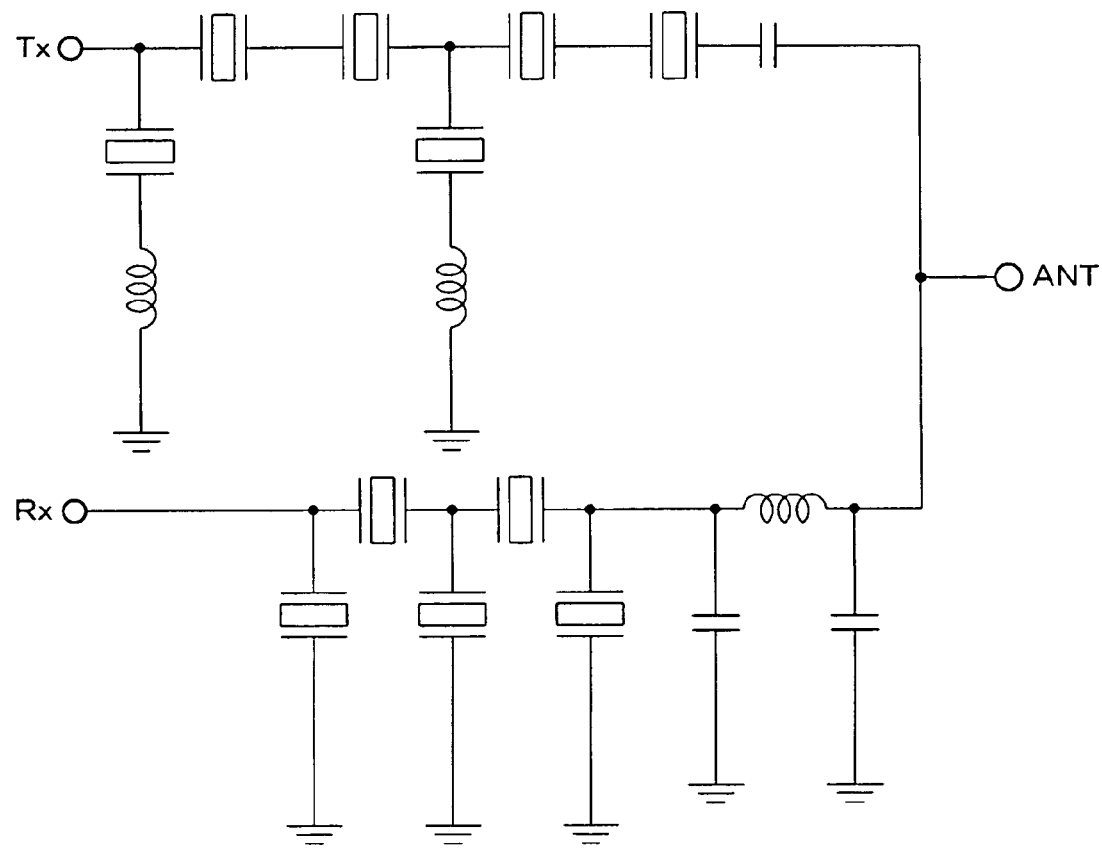
FIG. 16 is a circuit diagram showing a modification of the duplexer.

As shown in FIG. 16, each of the series resonators in the transmitting filter in FIG. 14 may be replaced with two series resonators.

A modification of the resonator in the transmitting filter 5 and the receiving filter 6 will now be described with reference to FIG. 17.

Figure 17:
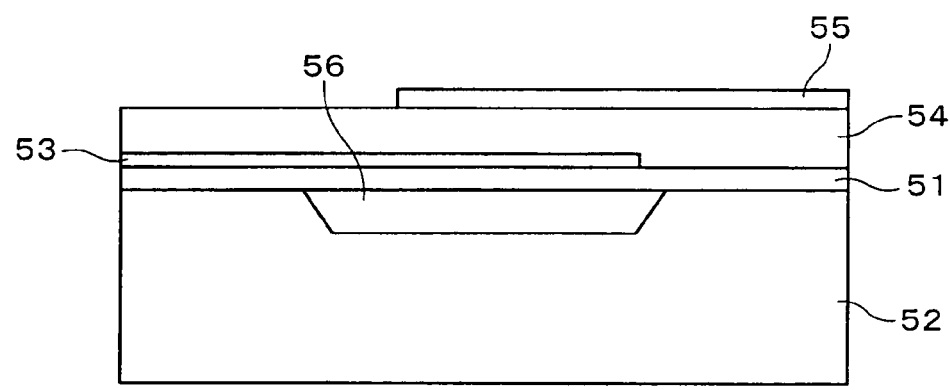
FIG. 17 is a schematic cross-sectional view showing a modification of the resonator in the transmitting filter and the receiving filter.

As shown in FIG. 17, the resonator includes an insulating film 51 on a recess 56 disposed on a substrate 52. The insulating film 51 is suspended over the recess 56 at the periphery.

A lower electrode 53, a piezoelectric thin film 54, and an upper electrode 55 are disposed on the insulating film 51.

The above-described structures of the piezoelectric thin film and the insulating film in the transmitting filter 5 and the receiving filter 6 can be applied to this structure. Thus, the same advantages can be achieved in this structure.

In addition, when the resonators of the transmitting filter 5 and the resonators of receiving filter 6 are composed of the same materials and are different only in the deposited order, the same deposition equipment can be used to reduce the cost.

The transmitting filter 5 including resonators including a piezoelectric thin film 34 preferably composed of ZnO, an insulating film 31a preferably composed of $SiO_2$, and an insulating film 31b preferably composed of AlN can achieve a Q factor of about 700 and an electromechanical coupling coefficient $k^2_{eff}$ of about 2.9%.

The receiving filter 6 including resonators having a piezoelectric thin film 44 composed of ZnO, an insulating film 41a composed of $Al_2O_3$, and an insulating film 41b composed of $SiO_2$ can achieve a Q factor of 400 and an electromechanical coupling coefficient $k^2_{eff}$ of about 5.3%.

Figure 18:
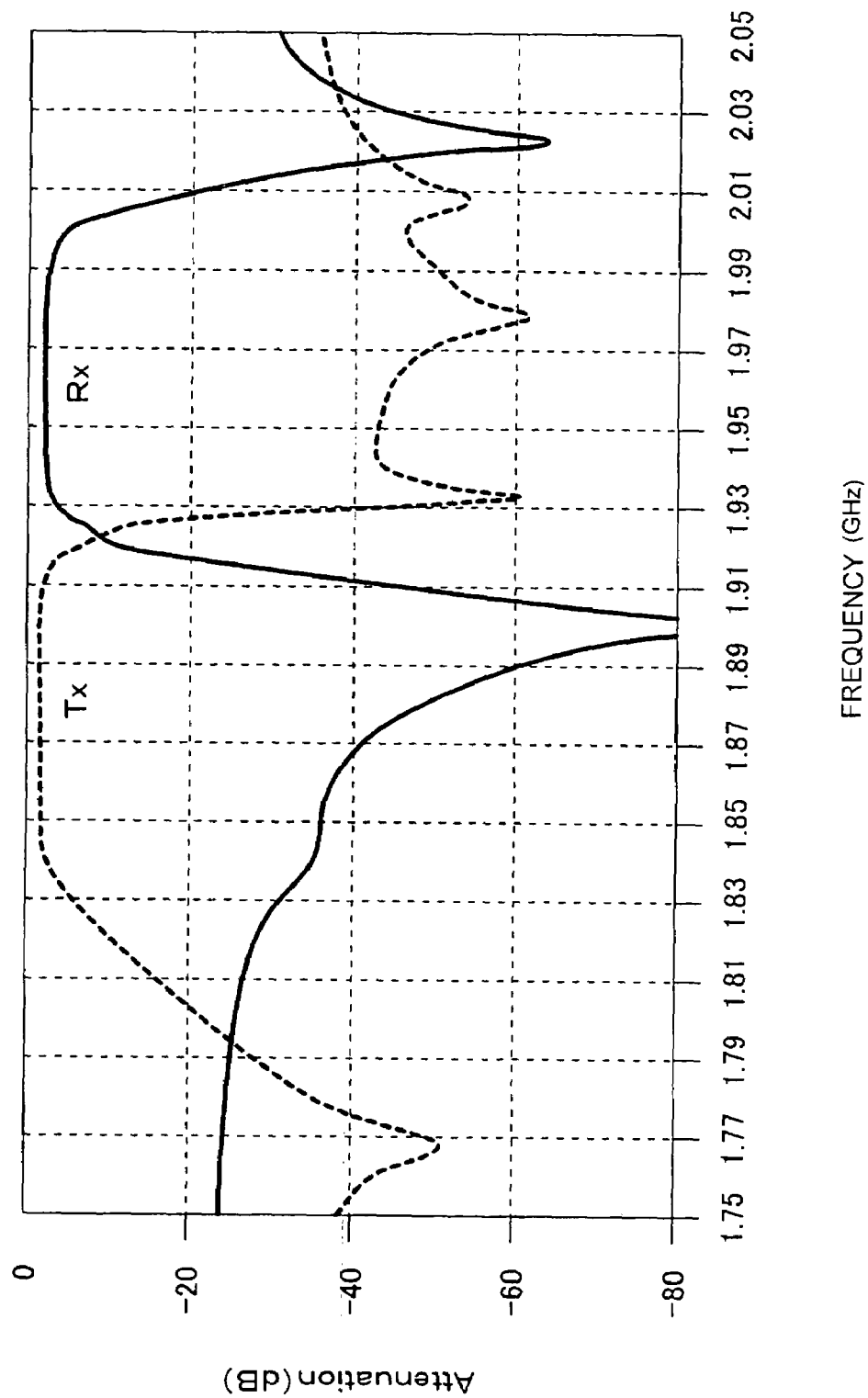
FIG. 18 is a graph showing the frequency characteristics of insertion loss in a transmitting filter and a receiving filter according to a preferred embodiment of the present invention.
Figure 19:
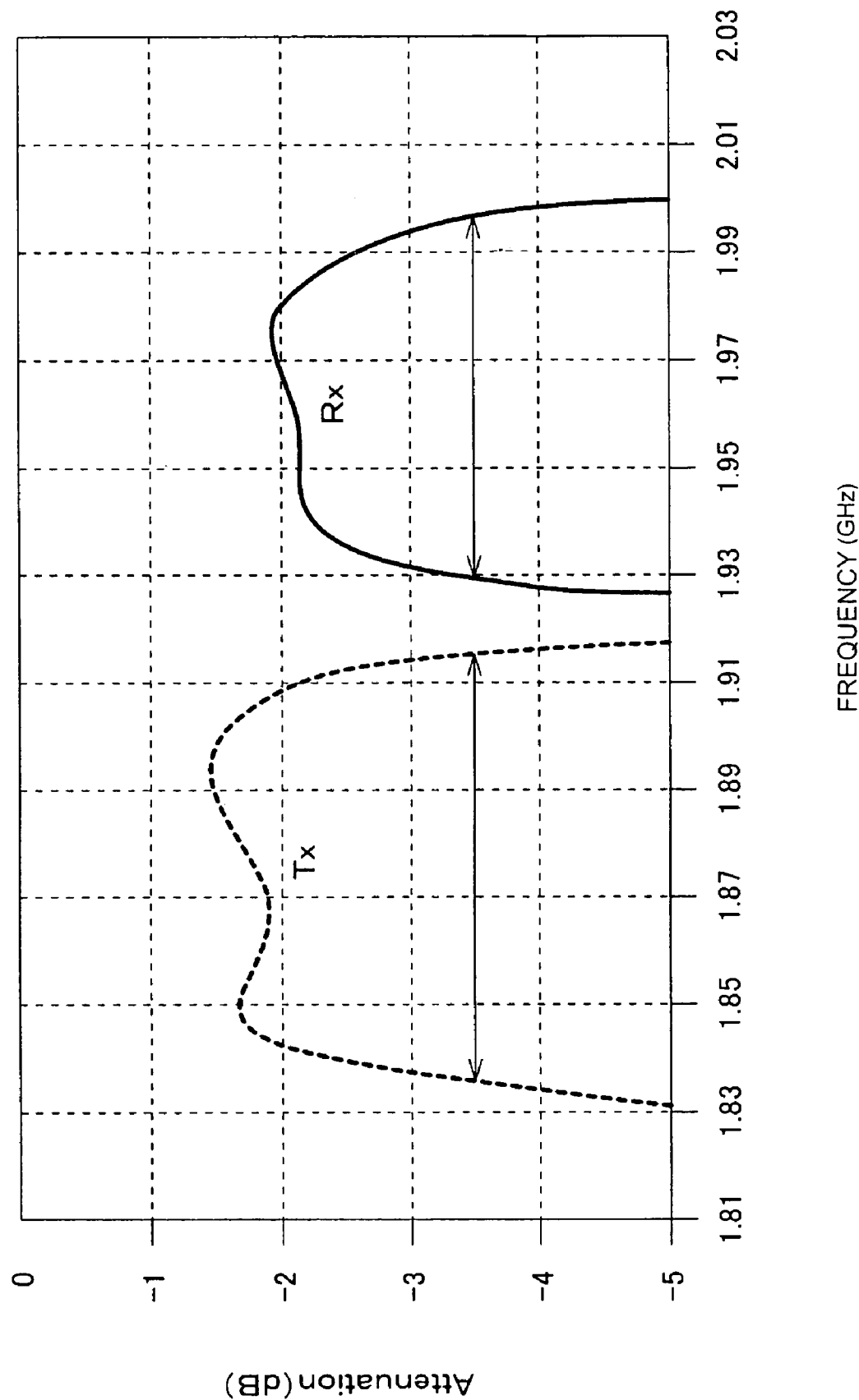
FIG. 19 is a graph showing the frequency characteristics of insertion loss in a transmitting filter and a receiving filter according to a preferred embodiment of the present invention.

FIGS. 18 and 19 show the frequency characteristics of insertion loss in the transmitting filter 5 and the receiving filter 6.

In the transmitting filter 5, the inductances are connected to the parallel resonators. Therefore, as shown in FIGS. 18 and 19, the bandwidth can be extended to the low frequency side despite the small electromechanical coupling coefficient $k^2_{eff}$.

In contrast, in the receiving filter 6, the bandwidth can be increased because of the large electromechanical coupling coefficient $k^2_{eff}$.

As shown in FIG. 19, regarding the bandwidth wherein the level is attenuated by about 3.5 dB, the transmitting filter 5 can provide the bandwidth of about 80 MHz, and the receiving filter 6 can provide the bandwidth of about 68 MHz.

Figure 20:
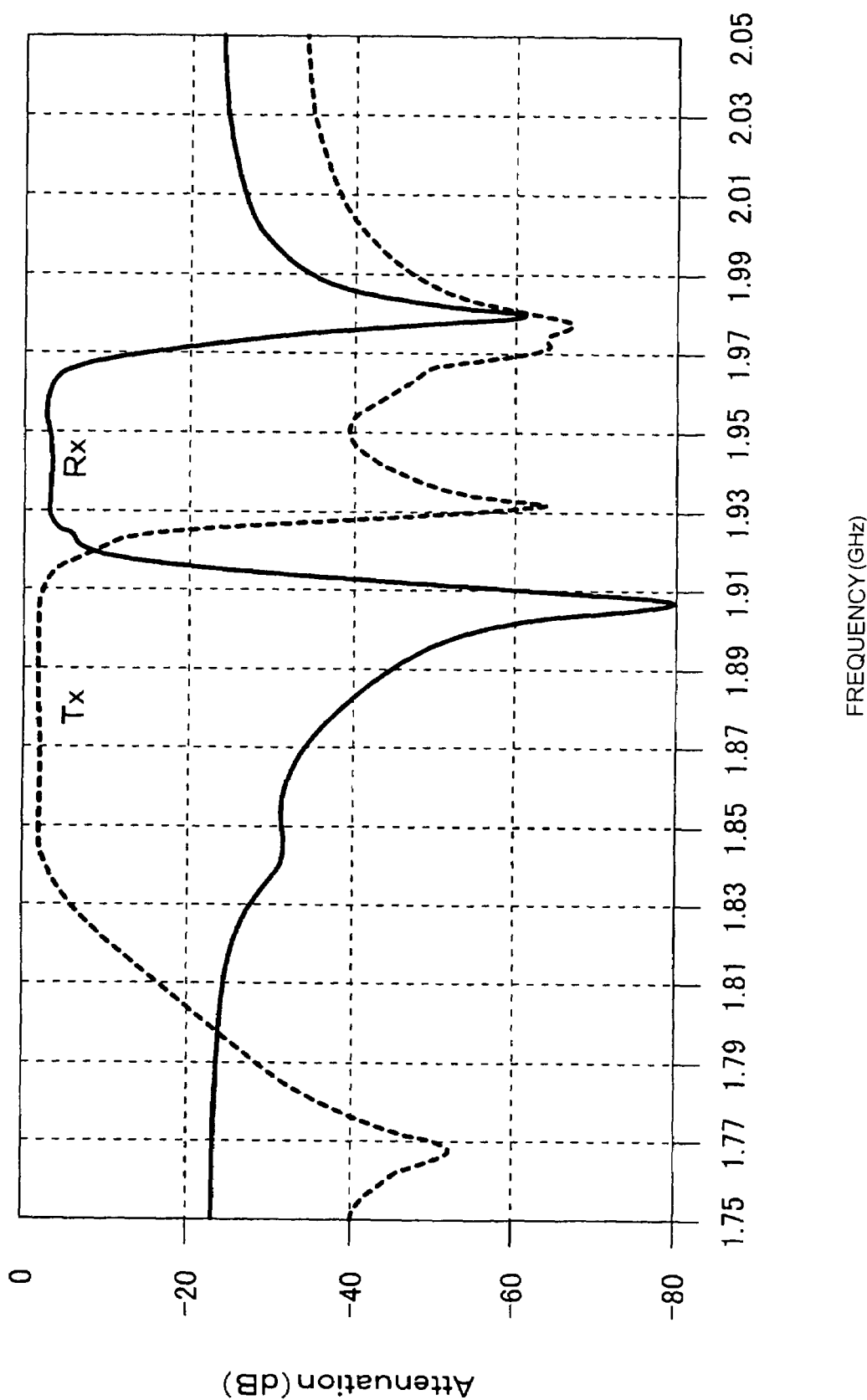
FIG. 20 is a graph showing the frequency characteristics of insertion loss in a transmitting filter and a receiving filter in a comparative example.
Figure 21:
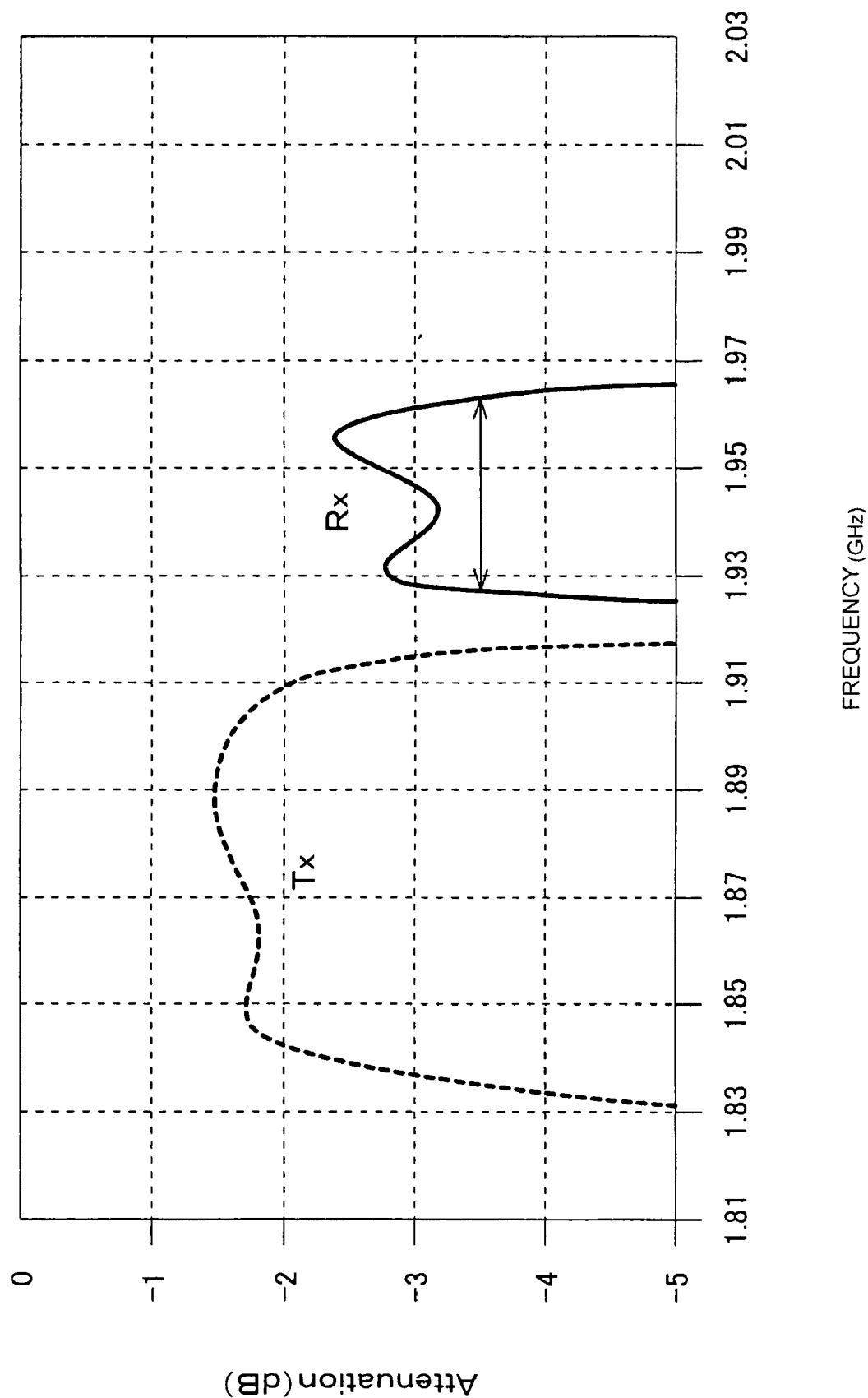
FIG. 21 is a graph showing the frequency characteristics of insertion loss in a transmitting filter and a receiving filter in a comparative example.

As a comparative example, a receiving filter 6 including resonators having a piezoelectric thin film 44 preferably composed of ZnO, an insulating film 41a preferably composed of $SiO_2$, and an insulating film 41b preferably composed of AlN is used. The resonators have a Q factor of about 700 and an electromechanical coupling coefficient $k^2_{eff}$ of about 2.9%. As shown in FIGS. 20 and 21, in this receiving filter 6, the bandwidth wherein the level is attenuated by about 3.5 dB is no more than about 36 MHz.

Fourth Preferred Embodiment

Figure 22:
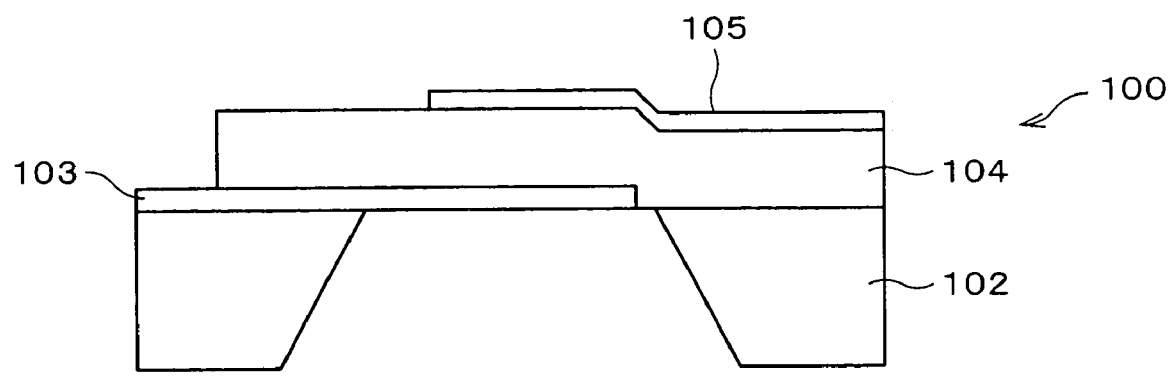
FIG. 22 is a cross-sectional view of a piezoelectric thin film resonator used in a fourth preferred embodiment of the present invention.

In the present preferred embodiment, the resonance characteristics in a piezoelectric thin film resonator 100 shown in FIG. 22 were investigated.

The piezoelectric thin film resonator 100 includes a supporting substrate 102 preferably composed of silicon (Si).

A lower electrode 103, a piezoelectric thin film 104 composed of ZnO, and an upper electrode 105 are disposed on the supporting substrate 102 in that order.

Furthermore, the supporting substrate 102 includes an opening or hollow portion that penetrates the supporting substrate 102 in the direction of the thickness and extends to the other side of the lower electrode 103.

A diaphragm facing the opening or hollow portion is formed.

In this experiment, the upper electrode 105 and the lower electrode 103 in the piezoelectric thin film resonator 100 were composed of the same material and had the same film thickness.

The material of the electrodes used in this example was aluminum Al, molybdenum Mo, copper Cu, tungsten W, and platinum Pt.

Figure 23:
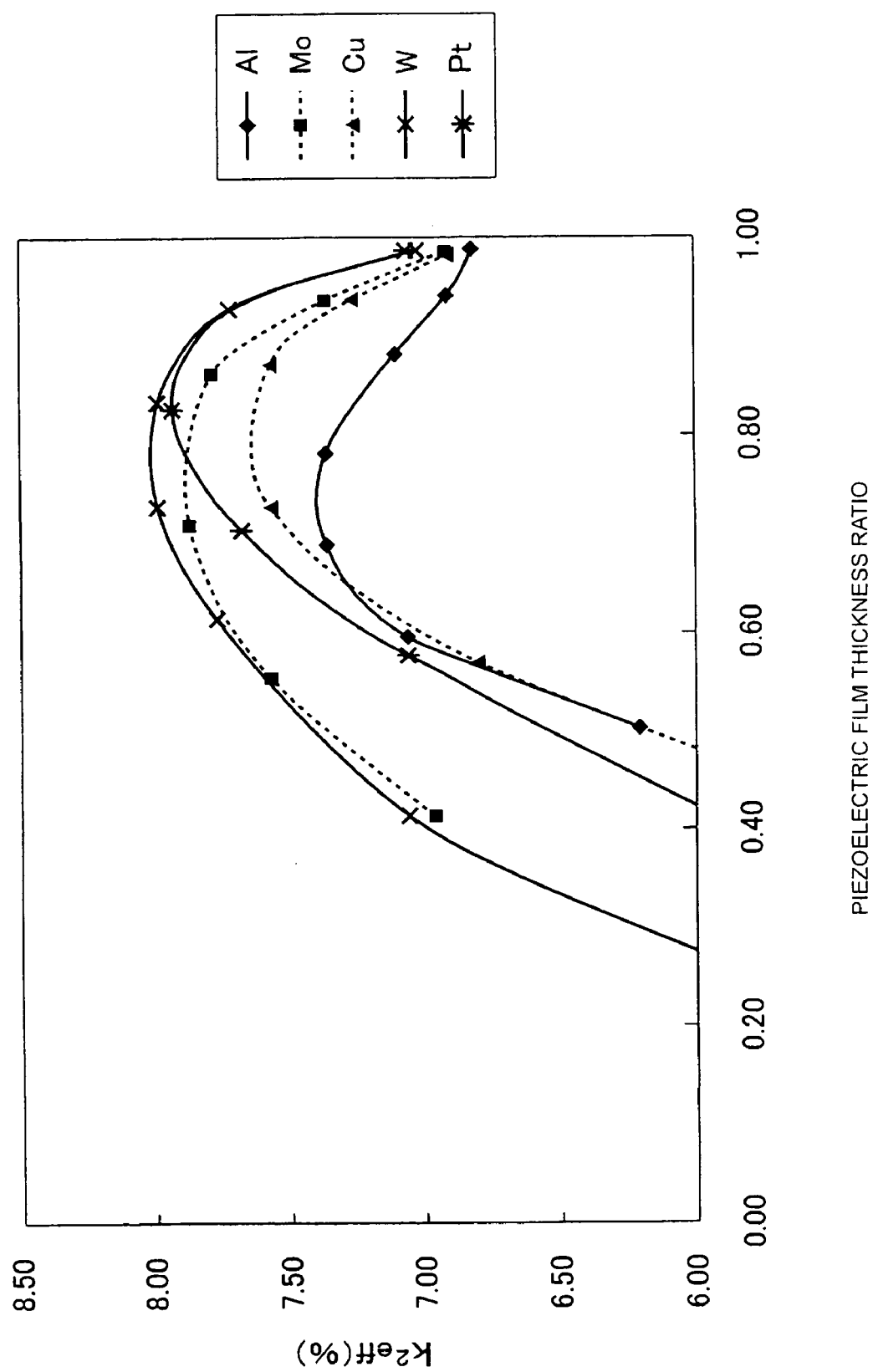
FIG. 23 is a graph showing an investigation result of the electromechanical coupling coefficient with the piezoelectric film thickness ratio in the fourth preferred embodiment of the present invention.

FIG. 23 shows the investigation result of the relationship between a piezoelectric film thickness ratio and the electromechanical coupling coefficient $(k^2_{eff})$ concerning the various materials of the electrodes. The piezoelectric film thickness ratio is the ratio of the film thickness of the piezoelectric thin film to the total film thickness (the thickness of the upper electrode 105 + the thickness of the piezoelectric thin film 104 + the thickness of the lower electrode 103) of the resonator.

As shown in FIG. 23, when the piezoelectric film thickness ratio was optimally selected, among the above-described five kinds of materials of the electrodes, the highest electromechanical coupling coefficient $(k^2_{eff})$ was achieved with W, and subsequently, Pt, Mo, Cu, and Al, in that order.

Table 1 shows the approximate acoustic impedance and the resistivity in the materials of the electrodes.

TABLE 1

| Material of electrodes | Acoustic impedance (Ns/m$^3$) | Resistivity (μΩ cm) |
|---|---|---|
| W | $1.0 \times 10^8$ | 5.5 |
| Pt | $7.5 \times 10^7$ | 10.6 |
| Mo | $6.9 \times 10^7$ | 5.7 |
| Cu | $3.9 \times 10^7$ | 1.7 |
| Al | $1.7 \times 10^7$ | 2.7 |

Referring to FIG. 23 and Table 1, the higher the acoustic impedance of the material, the higher the electromechanical coupling coefficient $(k^2_{eff})$ can be.

As shown in the first preferred embodiment to the third preferred embodiment, resonators having a large electromechanical coupling coefficient $(k^2_{eff})$ must be used in a filter (for example, receiving filter) disposed at the high frequency side of the duplexer.

In a filter (for example, transmitting filter) disposed at the low frequency side, the band can be extended by providing an external inductance. Therefore, even when resonators having a small electromechanical coupling coefficient $(k^2_{eff})$ are used, the steepness of the filter can be provided.

Accordingly, in the receiving filter, a material that has high acoustic impedance to increase the electromechanical coupling coefficient $(k^2_{eff})$ is preferably used as the electrodes.

On the other hand, in the transmitting filter, copper or aluminum that has low acoustic impedance but has a low resistivity is preferably used to form the electrodes. Thus, a duplexer having excellent characteristics can be produced.

Fifth Preferred Embodiment

Another preferred embodiment of the present invention will now be described with reference to FIG. 25.

For the convenience of description, components having the same function as those of the components shown in the first preferred embodiment to the fourth preferred embodiment have the same reference numerals and the description is omitted.

Figure 25:
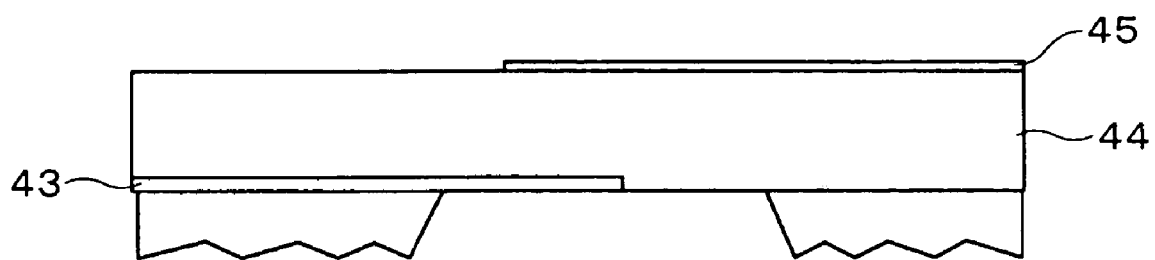
FIG. 25 is a schematic cross-sectional view showing the structure of a resonator of a receiving filter according to a preferred embodiment of the present invention.

In the present preferred embodiment, as shown in FIG. 25, resonators of a receiving filter 6 can use fundamental waves.

The resonators using fundamental waves can have an electromechanical coupling coefficient $k^2_{eff}$ that is larger than that of the resonators using second harmonic waves, which are shown in FIGS. 2 to 4 and FIG. 9.

Consequently, a pass band required in the receiving filter can be provided.

For example, a duplexer may include resonators of the receiving filter 6 having a piezoelectric thin film preferably composed of AlN and using fundamental waves, and resonators of the transmitting filter 5 having a piezoelectric thin film preferably composed of ZnO and using second harmonic waves. Thus, a duplexer having excellent characteristics can be achieved.

A communication device using the duplexer described in the above-described preferred embodiment will now be described with reference to FIG. 24.

At the receiving side (Rx side) wherein receiving is performed, the communication device 600 includes an antenna 601, an antenna common/RF Top filter 602, an amplifier 603, an Rx interstage filter 604, a mixer 605, a 1st IF filter 606, a mixer 607, a 2nd IF filter 608, a 1st+2nd local synthesizer 611, a temperature compensated crystal oscillator (TCXO) 612, a divider 613, and a local filter 614.

Figure 24:
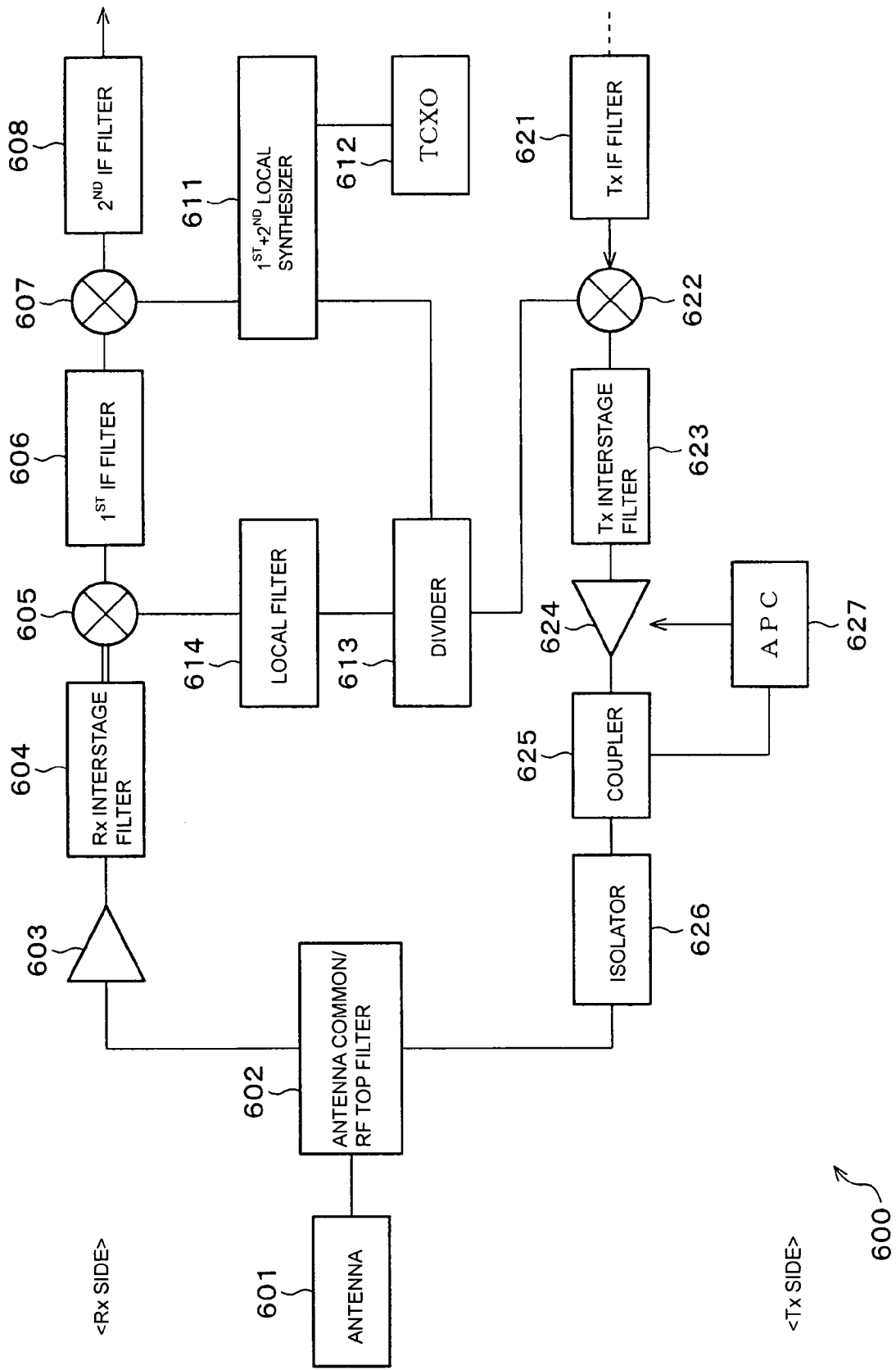
FIG. 24 is a circuit block diagram of a communication device including a duplexer according to various preferred embodiments of the present invention.

As shown by the double lines in FIG. 24, the transmitting from the Rx interstage filter 604 to the mixer 605 is preferably performed with balanced signals so as to secure the balance.

At the transceiving side (Tx side) wherein transmitting is performed, the communication device 600 shares the antenna 601 and the antenna common/RF Top filter 602, and includes a Tx IF filter 621, a mixer 622, a Tx interstage filter 623, an amplifier 624, a coupler 625, an isolator 626, and an automatic power control (APC) 627.

The duplexer of the above-described preferred embodiment can be suitably used as the Rx interstage filter 604 and the RF Top filter 602.

The present invention is not limited to the above-described preferred embodiments and various modifications are possible within the scope shown in the claims. The technical field of the present invention also includes embodiments obtained by appropriately combining technical methods disclosed in the different embodiments.

The branching filter including filters having piezoelectric thin film resonators of the present invention can be applied to various communication devices such as a cellular phone.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

The invention claimed is:

1. A branching filter comprising:
a transmitting filter; and
a receiving filter; wherein
piezoelectric thin film resonators defining the transmitting filter and the receiving filter and including at least one piezoelectric thin film sandwiched between at least one pair of opposed electrodes are arranged in a ladder configuration on an opening or a recess of a substrate, the transmitting filter and the receiving filter being connected to an antenna terminal in parallel;
the piezoelectric thin film resonators defining the transmitting filter and the piezoelectric thin film resonators defining the receiving filter are made of different materials from each other; and
the piezoelectric thin film resonators defining the transmitting filter and the piezoelectric thin film resonators defining the receiving filter have different piezoelectric films.

2. The branching filter according to claim 1, wherein the piezoelectric film of the piezoelectric thin film resonators defining the transmitting filter includes AlN and the piezoelectric film of the piezoelectric thin film resonators defining the receiving filter includes ZnO.

3. The branching filter according to claim 1, wherein the material of the electrodes is different between the piezoelectric thin film resonators defining the transmitting filter and the piezoelectric thin film resonators defining the receiving filter.

4. The branching filter according to claim 3, wherein the acoustic impedance of the material of the electrodes is different between the piezoelectric thin film resonators defining the transmitting filter and the piezoelectric thin film resonators defining the receiving filter.

5. The branching filter according to claim 3, wherein the frequency of the pass band of the receiving filter is higher than the frequency of the pass band of the transmitting filter, and the acoustic impedance of the material of the electrodes defining the receiving filter is higher than the acoustic impedance of the material of the electrodes defining the transmitting filter.

6. A communication device comprising the branching filter according to claim 1.

7. A branching filter comprising:
a transmitting filter; and
a receiving filter; wherein
piezoelectric thin film resonators defining the transmitting filter and the receiving filter and including at least one piezoelectric thin film sandwiched between at least one pair of opposed electrodes are arranged in a ladder configuration on an opening or a recess of a substrate, the transmitting filter and the receiving filter being connected to an antenna terminal in parallel;
the piezoelectric thin film resonators defining the transmitting filter and the piezoelectric thin film resonators defining the receiving filter are made of different materials from each other; and
the piezoelectric thin film resonators defining the transmitting filter use second harmonic waves and the piezoelectric thin film resonators defining the receiving filter use fundamental waves.

8. A branching filter comprising:
a transmitting filter; and
a receiving filter; wherein
piezoelectric thin film resonators defining the transmitting filter and the receiving filter and including at least one piezoelectric thin film sandwiched between at least one pair of opposed electrodes are arranged in a ladder configuration on an opening or a recess of a substrate, the transmitting filter and the receiving filter being connected to an antenna terminal in parallel;
the piezoelectric thin film resonators defining the transmitting filter and the piezoelectric thin film resonators defining the receiving filter are made of different materials from each other; and
the piezoelectric thin film resonators defining the transmitting filter and the piezoelectric thin film resonators defining the receiving filter further comprise a different insulating film on the opening or the recess of the substrate.

9. The branching filter according to claim 8, wherein the insulating film of the piezoelectric thin film resonators defining the receiving filter comprises $SiO_2$.

10. The branching filter according to claim 8, wherein the insulating film of the piezoelectric thin film resonators defining the receiving filter comprises two layers including an $SiO_2$ layer adjacent to the piezoelectric thin film and an $Al_2O_3$ layer adjacent to the $SiO_2$ layer.

11. The branching filter according to claim 8, wherein the insulating film of the piezoelectric thin film resonators defining the receiving filter comprises two layers including an $SiO_2$ layer adjacent to the piezoelectric thin film and an AlN layer adjacent to the $SiO_2$ layer.

12. The branching filter according to claim 8, wherein the insulating film of the piezoelectric thin film resonators defining the transmitting filter comprises two layers including an AlN layer adjacent to the piezoelectric thin film and an $SiO_2$ layer adjacent to the AlN layer.

13. The branching filter according to claim 8, wherein the insulating film of the piezoelectric thin film resonators defining the transmitting filter comprises two layers including an $Al_2O_3$ layer adjacent to the piezoelectric thin film and an $SiO_2$ layer adjacent to the $Al_2O_3$ layer.

14. A branching filter comprising:
a transmitting filter; and
a receiving filter; wherein
piezoelectric thin film resonators defining the transmitting filter and the receiving filter and including at least one piezoelectric thin film sandwiched between at least one pair of opposed electrodes are arranged in a ladder configuration on an opening or a recess of a substrate, the transmitting filter and the receiving filter being connected to an antenna terminal in parallel;
the piezoelectric thin film resonators defining the transmitting filter and the piezoelectric thin film resonators defining the receiving filter use different waves from each other; and
the piezoelectric thin film resonators defining the transmitting filter and the piezoelectric thin film resonators defining the receiving filter have different piezoelectric films.

15. The branching filter according to claim 14, wherein the piezoelectric film of the piezoelectric thin film resonators defining the transmitting filter includes AlN and the piezoelectric film of the piezoelectric thin film resonators defining the receiving filter includes ZnO.

16. The branching filter according to claim 14, wherein the material of the electrodes is different between the piezoelectric thin film resonators defining the transmitting filter and the piezoelectric thin film resonators defining the receiving filter.

17. The branching filter according to claim 16, wherein the acoustic impedance of the material of the electrodes is different between the piezoelectric thin film resonators defining the transmitting filter and the piezoelectric thin film resonators defining the receiving filter.

18. The branching filter according to claim 16, wherein the frequency of the pass band of the receiving filter is higher than the frequency of the pass band of the transmitting filter, and the acoustic impedance of the material of the electrodes defining the receiving filter is higher than the acoustic impedance of the material of the electrodes defining the transmitting filter.

19. A communication device comprising the branching filter according to claim 14.

20. A branching filter comprising:
a transmitting filter; and
a receiving filter; wherein
piezoelectric thin film resonators defining the transmitting filter and the receiving filter and including at least one piezoelectric thin film sandwiched between at least one pair of opposed electrodes are arranged in a ladder configuration on an opening or a recess of a substrate, the transmitting filter and the receiving filter being connected to an antenna terminal in parallel;
the piezoelectric thin film resonators defining the transmitting filter and the piezoelectric thin film resonators defining the receiving filter use different waves from each other; and
the piezoelectric thin film resonators defining the transmitting filter use second harmonic waves and the piezoelectric thin film resonators defining the receiving filter use fundamental waves.

21. A branching filter comprising:
a transmitting filter; and
a receiving filter; wherein
piezoelectric thin film resonators defining the transmitting filter and the receiving filter and including at least one piezoelectric thin film sandwiched between at least one pair of opposed electrodes are arranged in a ladder configuration on an opening or a recess of a substrate, the transmitting filter and the receiving filter being connected to an antenna terminal in parallel;
the piezoelectric thin film resonators defining the transmitting filter and the piezoelectric thin film resonators defining the receiving filter use different waves from each other; and
the piezoelectric thin film resonators defining the transmitting filter and the piezoelectric thin film resonators defining the receiving filter further comprise a different insulating film on the opening or the recess of the substrate.

22. The branching filter according to claim 21, wherein the insulating film of the piezoelectric thin film resonators defining the receiving filter comprises $SiO_2$.

23. The branching filter according to claim 21, wherein the insulating film of the piezoelectric thin film resonators defining the receiving filter comprises two layers including an $SiO_2$ layer adjacent to the piezoelectric thin film and an $Al_2O_3$ layer adjacent to the $SiO_2$ layer.

24. The branching filter according to claim 21, wherein the insulating film of the piezoelectric thin film resonators defining the receiving filter comprises two layers including an $SiO_2$ layer adjacent to the piezoelectric thin film and an AlN layer adjacent to the $SiO_2$ layer.

25. The branching filter according to claim 21, wherein the insulating film of the piezoelectric thin film resonators defining the transmitting filter comprises two layers including an AlN layer adjacent to the piezoelectric thin film and an $SiO_2$ layer adjacent to the AlN layer.

26. The branching filter according to claim 21, wherein the insulating film of the piezoelectric thin film resonators defining the transmitting filter comprises two layers including an $Al_2O_3$ layer adjacent to the piezoelectric thin film and an $SiO_2$ layer adjacent to the $Al_2O_3$ layer.

* * * * *